(12) United States Patent
Schrems et al.

(10) Patent No.: US 6,200,873 B1
(45) Date of Patent: Mar. 13, 2001

(54) PRODUCTION METHOD FOR A TRENCH CAPACITOR WITH AN INSULATION COLLAR

(75) Inventors: Martin Schrems, Langerbrück (DE); Norbert Arnold, Chestnut Ridge, NY (US)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/395,226

(22) Filed: Sep. 13, 1999

(30) Foreign Application Priority Data

Sep. 17, 1998 (DE) .............................. 198 42 665

(51) Int. Cl.$^7$ ............................... H01L 21/8242
(52) U.S. Cl. .................. 438/386; 438/246; 438/242; 438/243; 438/526
(58) Field of Search .................. 438/386, 246, 438/243; 257/301, 303, 305

(56) References Cited

U.S. PATENT DOCUMENTS

| 4,937,205 | | 6/1990 | Nakayama et al. | 437/165 |
|---|---|---|---|---|
| 5,250,829 | * | 10/1993 | Bronner et al. | 257/301 |
| 5,336,912 | | 8/1994 | Ohtsuki | 257/304 |
| 5,344,381 | | 9/1994 | Caram | 494/56 |
| 5,399,389 | * | 3/1995 | Hieber et al. | 427/533 |
| 5,529,944 | * | 6/1996 | Rajeevkumar | 438/246 |
| 5,981,322 | * | 11/1999 | Mandelman et al. | 438/246 |
| 5,981,332 | * | 11/1999 | Mandelman et al. | 438/246 |

FOREIGN PATENT DOCUMENTS 0 644 591 A1  3/1995  (EP) .

OTHER PUBLICATIONS

L. Nesbit: "A 0.6 $\mu m^2$ 256 Mb Trench DRAM Cell With Self–Aligned BuriED STrap (BEST)", IEDM 93–627–630.
T. Ozaki et al.: "0.228 $\mu m^2$ Trench Cell Technologies with Bottle–Shaped Capacitor for 1Gbit DRAMs", IEDM 95–661–664.

Norbert Eibel et al.: "A New STI Process Based on Selective Oxide Deposition", 1998 Symposium on VLSI Technology Digest of Technical Papers, pp. 208–209.

Frank S. Becker et al.: "Low Pressure Deposition of Doped $SiO_2$ by Pyrolysis of Tetraethylorthosilicate (TEOS)", J. Electrochem. Soc., vol. 136, No. 10, Oct. 1989, pp. 3033–3043.

C.M. Ransom et al.: "Shallow $n^+$ Junctions in Silicon by Arsenci Gas–Phase Doping", J. Electrochem. Soc., vol. 141, No. May 5, 1994, pp. 1378–1381.

* cited by examiner

Primary Examiner—Matthew Smith
Assistant Examiner—Belur Keshavan
(74) Attorney, Agent, or Firm—Herbert L. Lerner; Laurence A. Greenberg; Werner H. Stemer

(57) ABSTRACT

The present invention provides a method for fabricating a trench capacitor, in particular for use in a semiconductor memory cell (100), with an insulation collar (168'; 168"), having the following steps: provision of a substrate (101); formation of a trench (108) in the substrate (101); provision of a first layer (177) on the trench wall; provision of a second layer (178) on the first layer (177) on the trench wall; filling of the trench (108) with a first filling material (152); removal of the first filling material (152) from the upper region of the trench (108) in order to define a collar region; removal of the second layer (178) from the upper region of the trench (108); removal of the first filling material (152) from the lower region of the trench (108); removal of the first layer (177) from the upper region of the trench (108); local oxidation of the upper region of the trench (108) in order to produce the insulation collar (168'; 168"); removal of the first and second layers (177; 178) from the lower region of the trench; formation of a dielectric layer (164) in the lower region of the trench (108) and on the inner side of the insulation collar (168'; 168"); and filling of the trench (108) with a conductive second filling material (161).

14 Claims, 20 Drawing Sheets

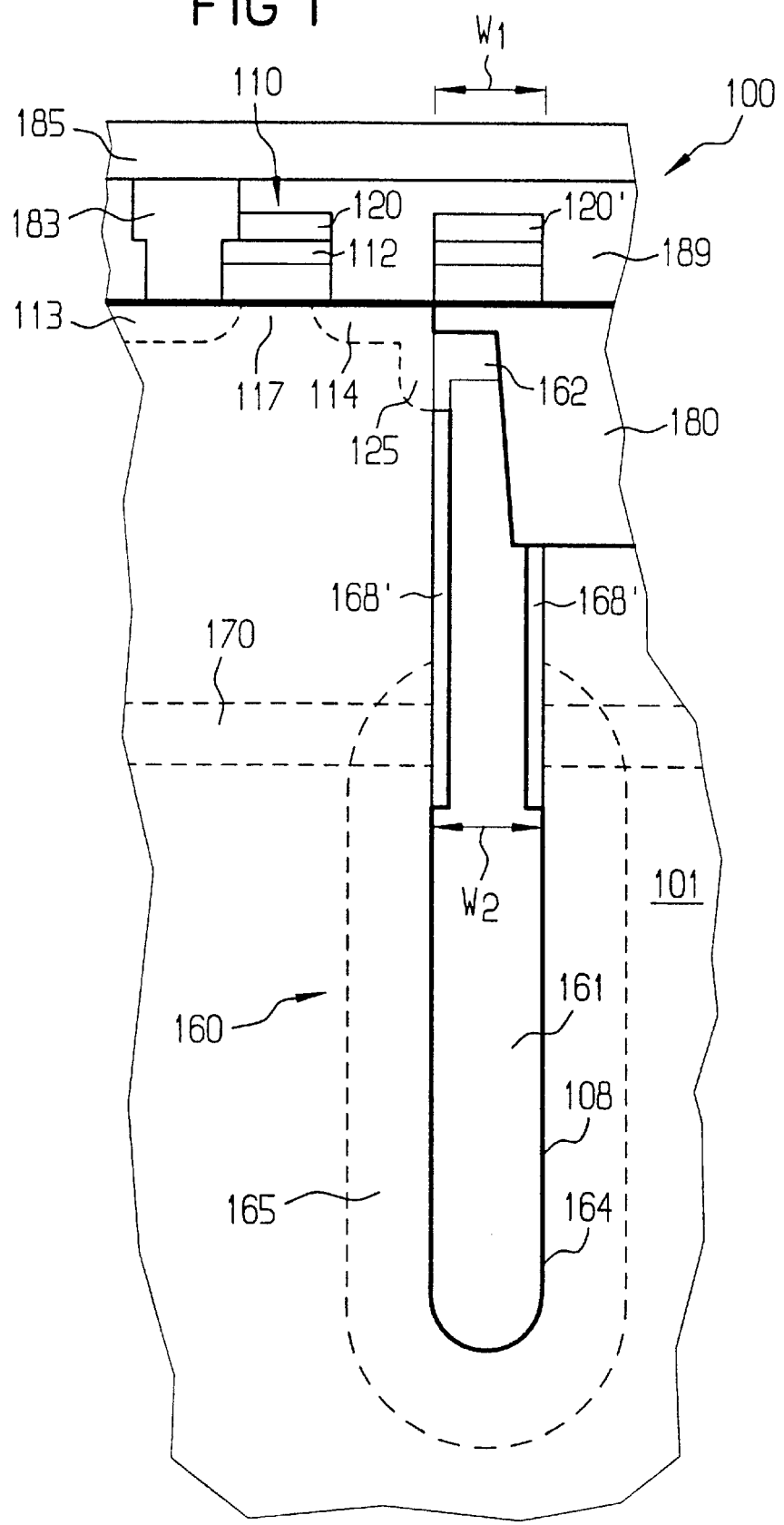

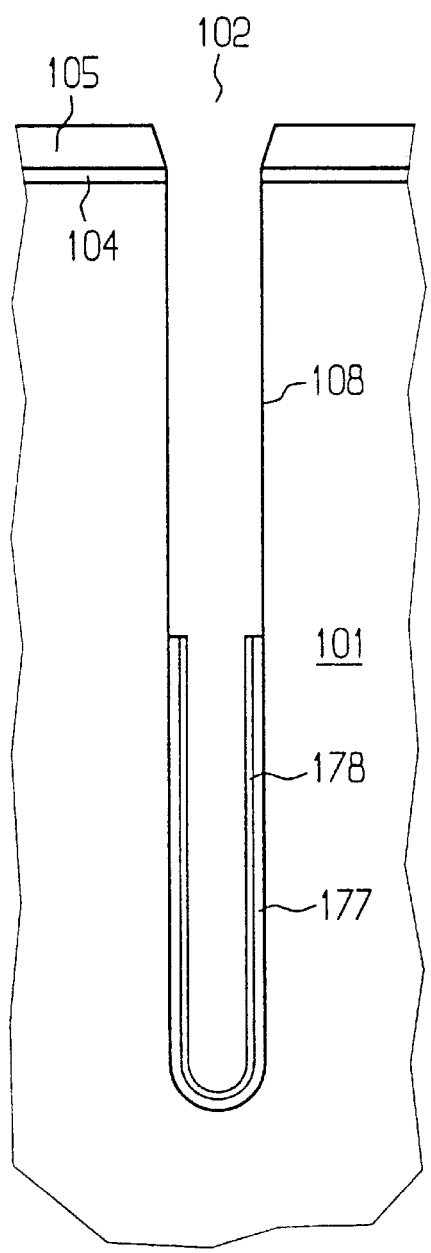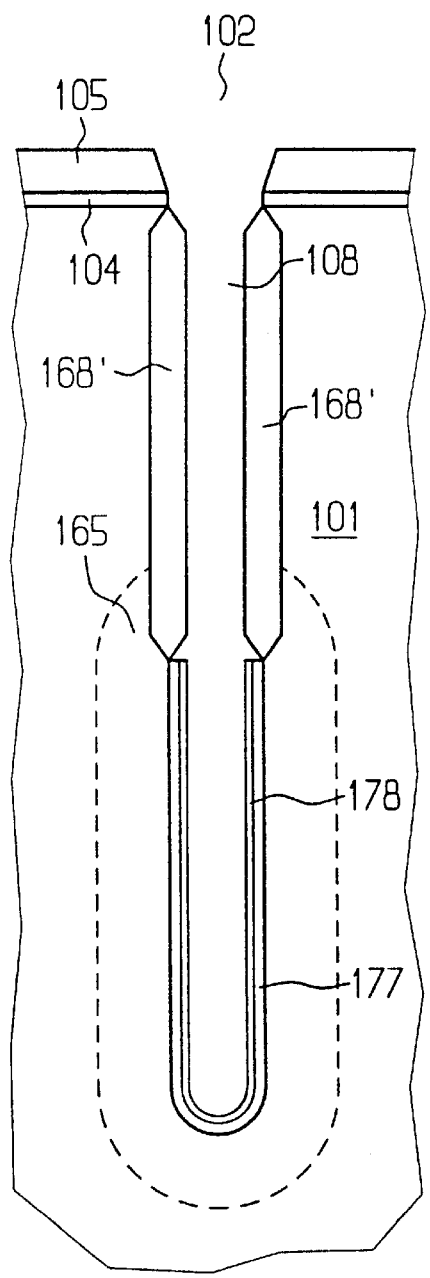

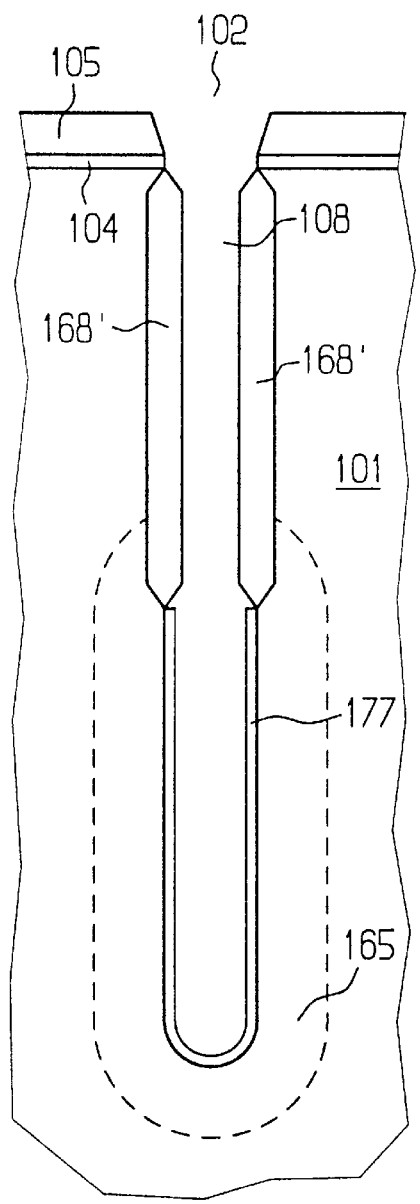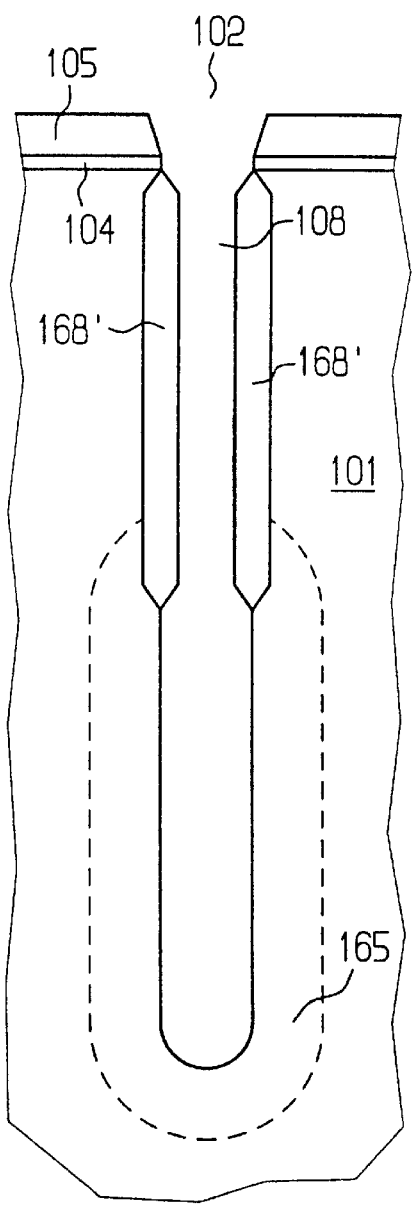

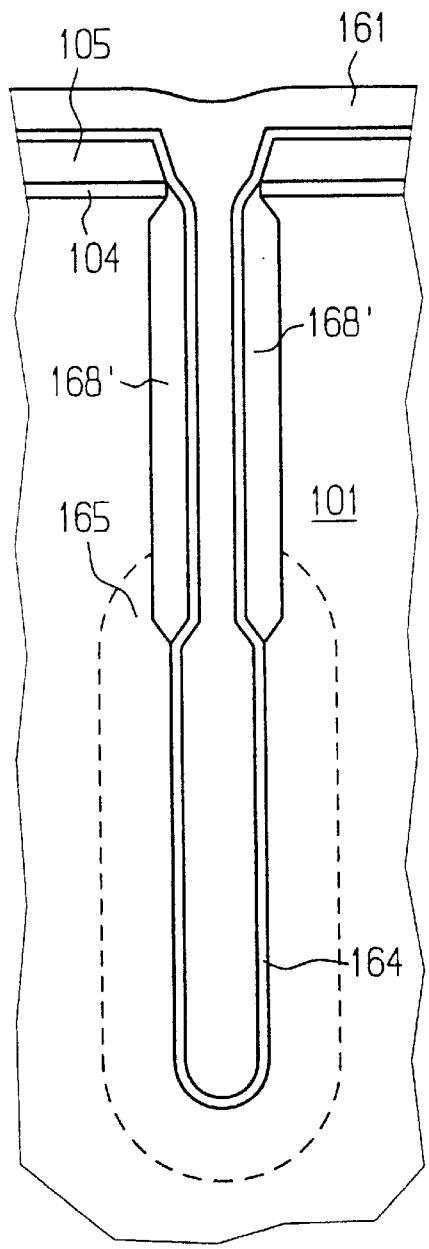
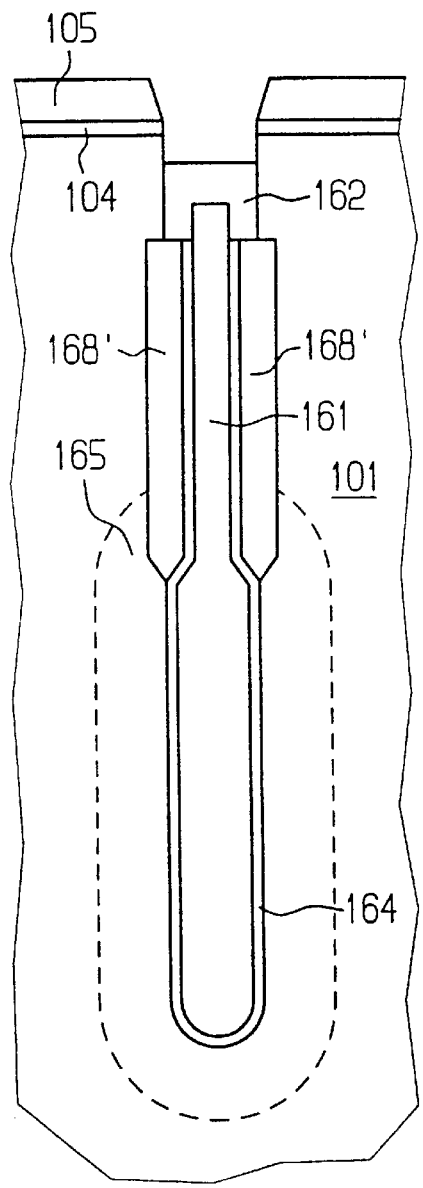

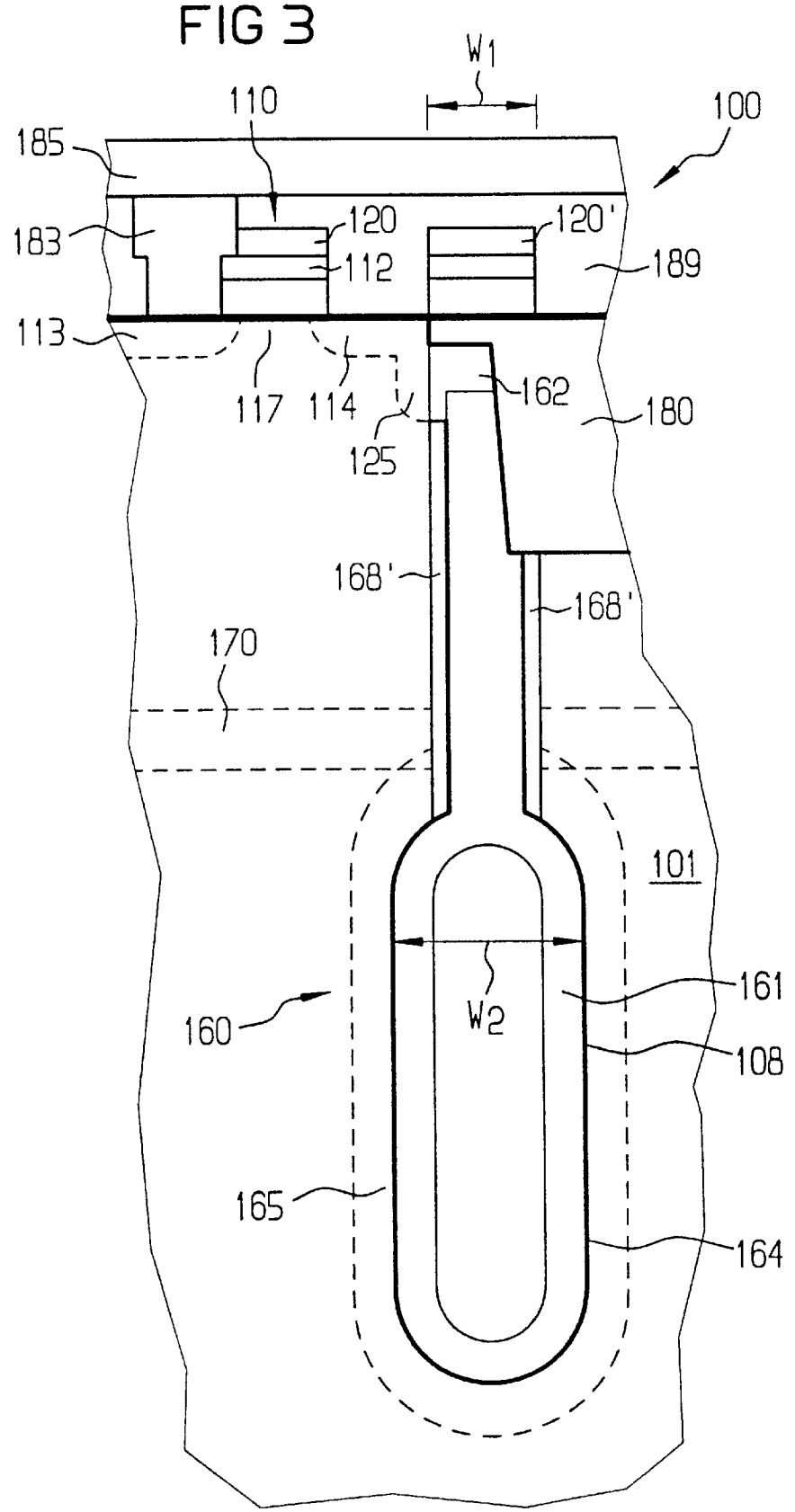

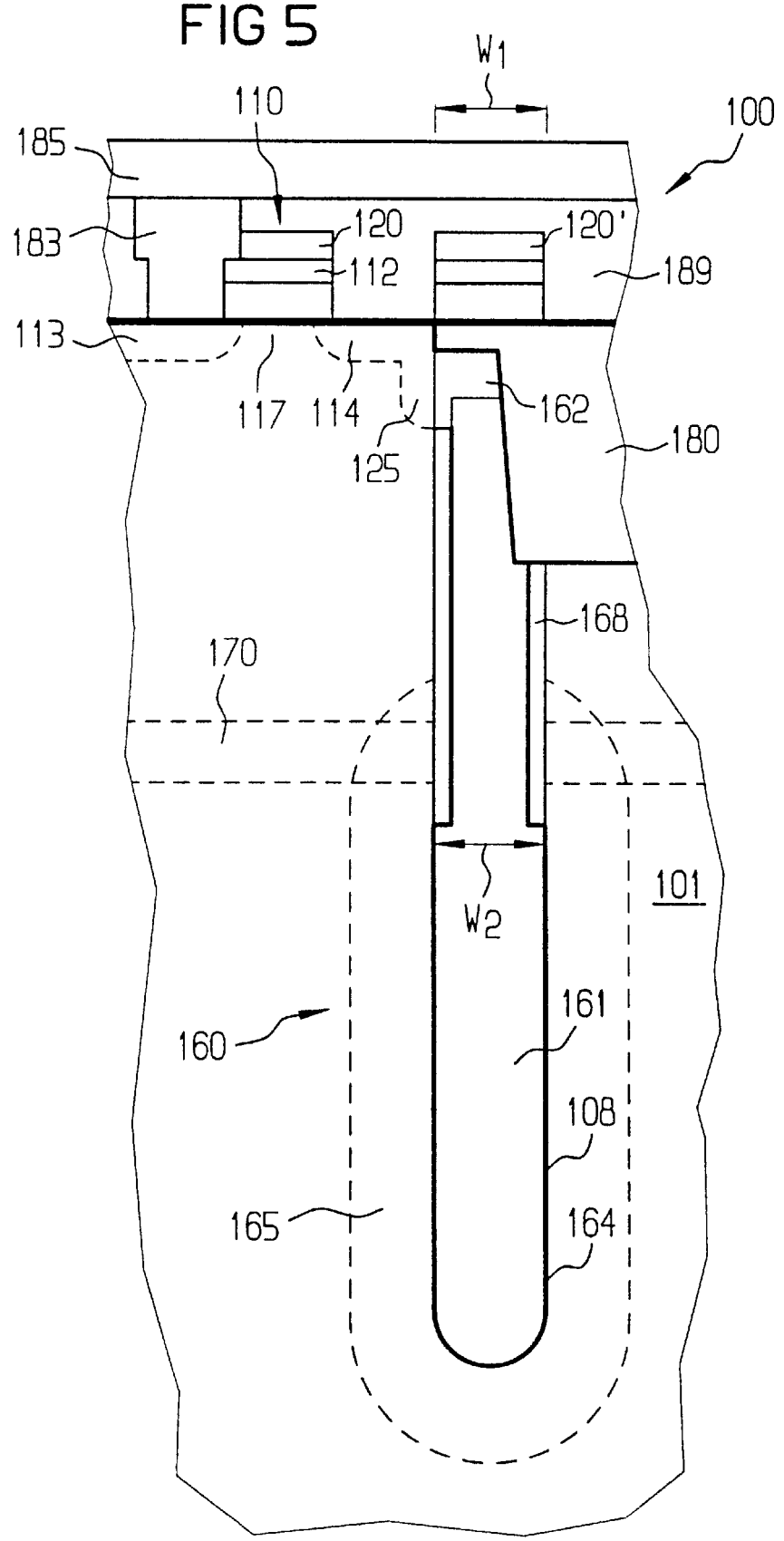

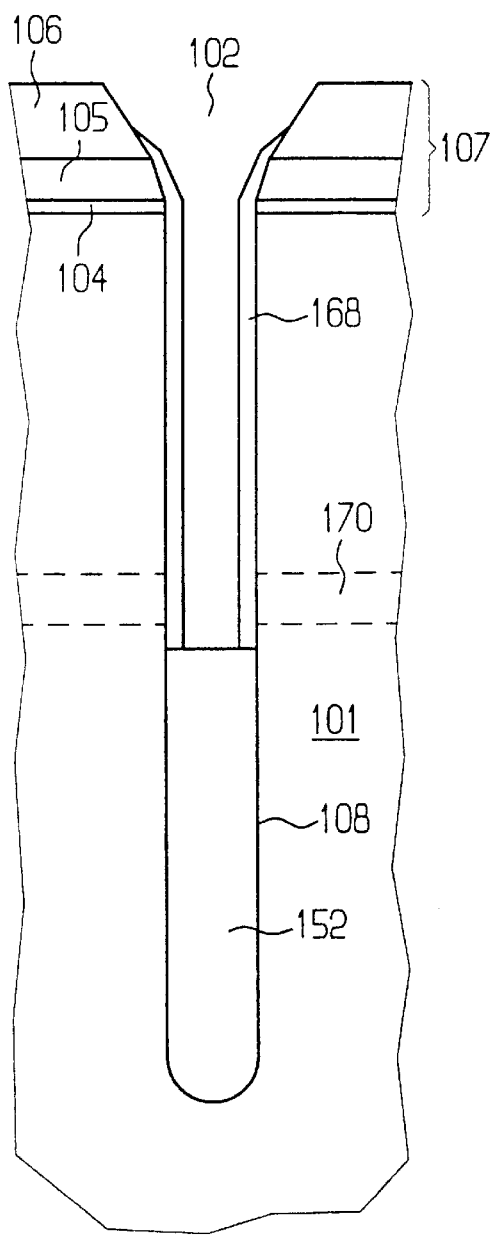
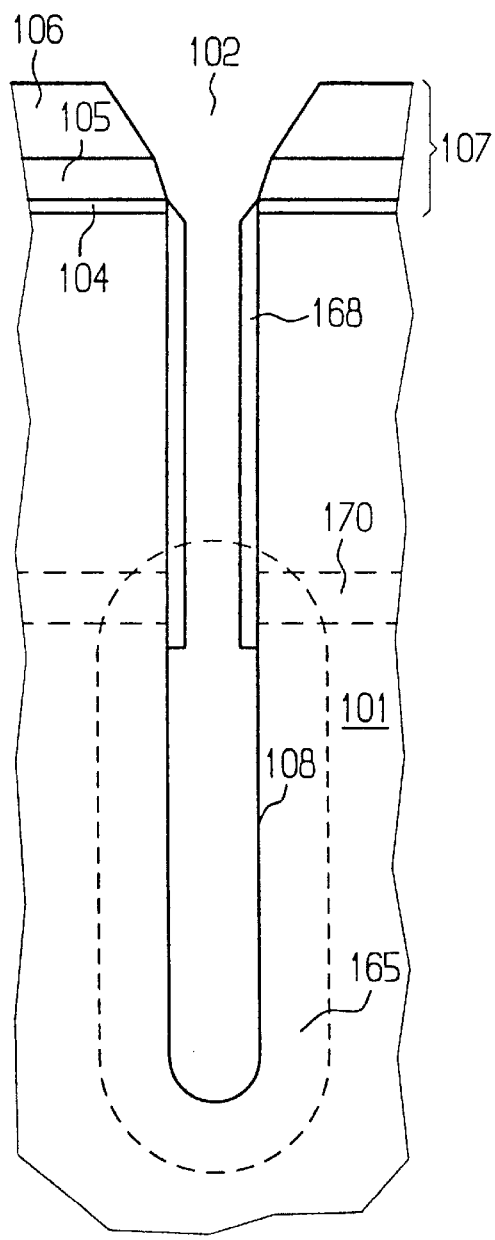

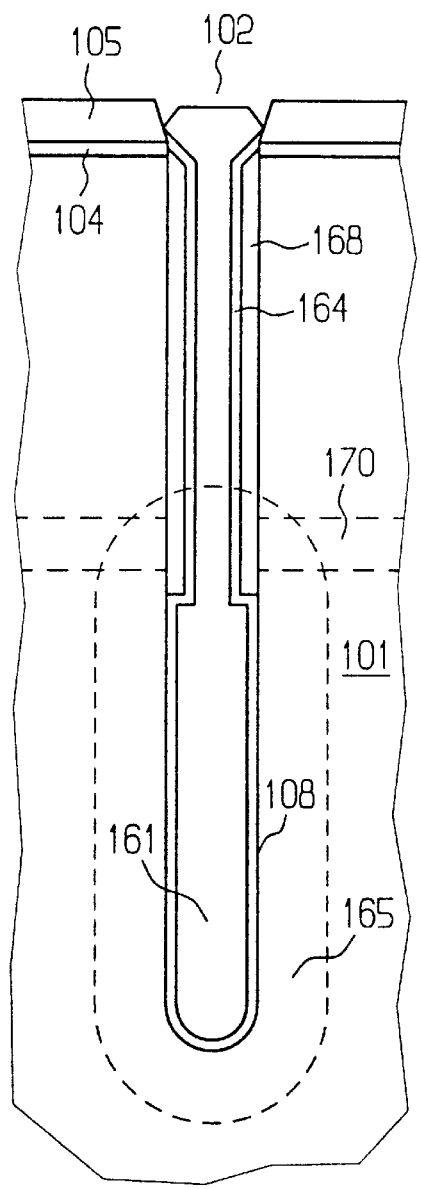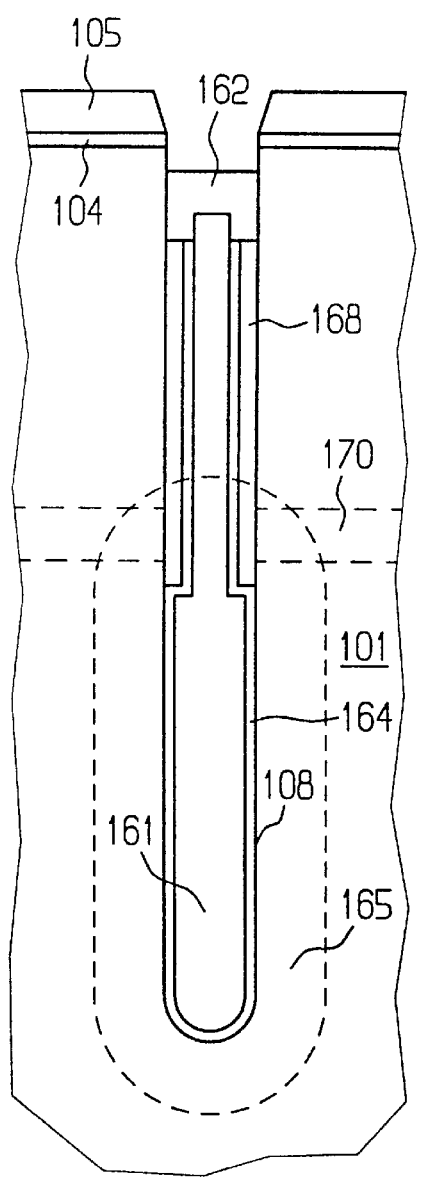

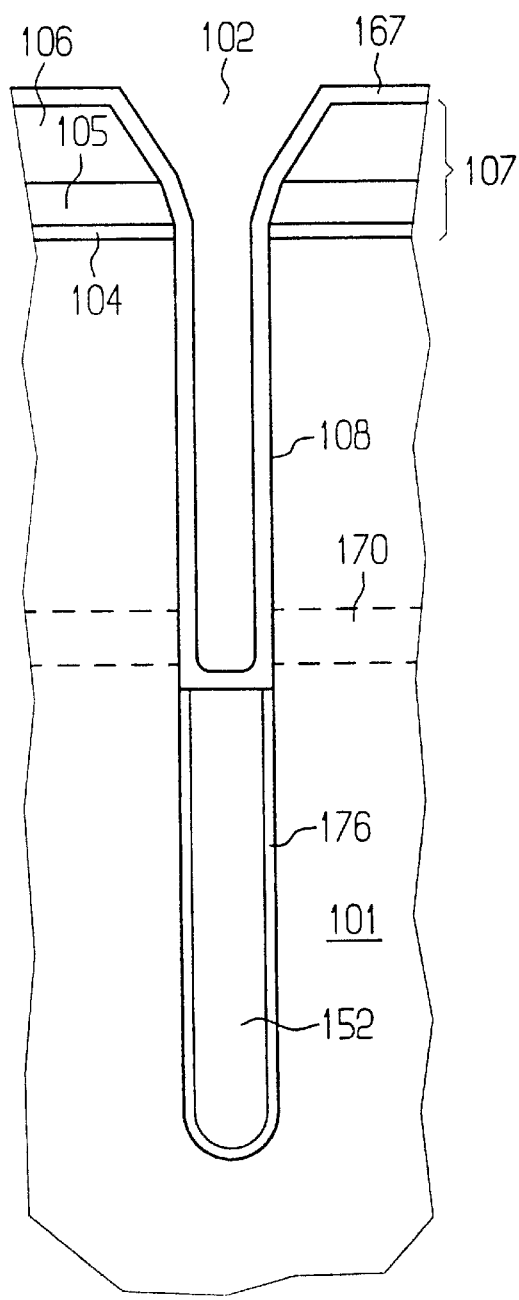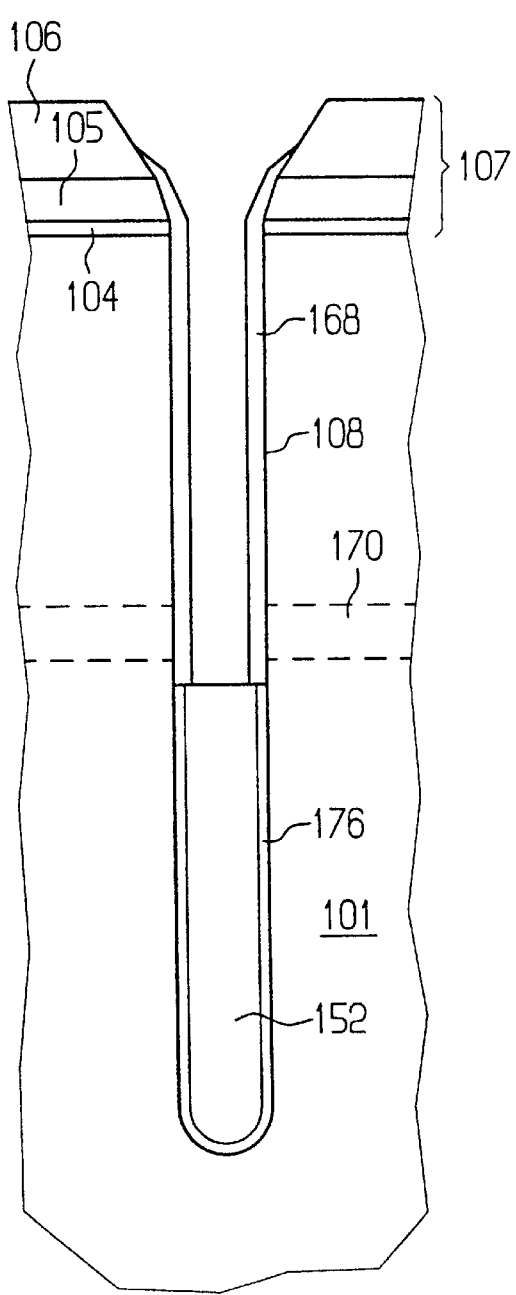

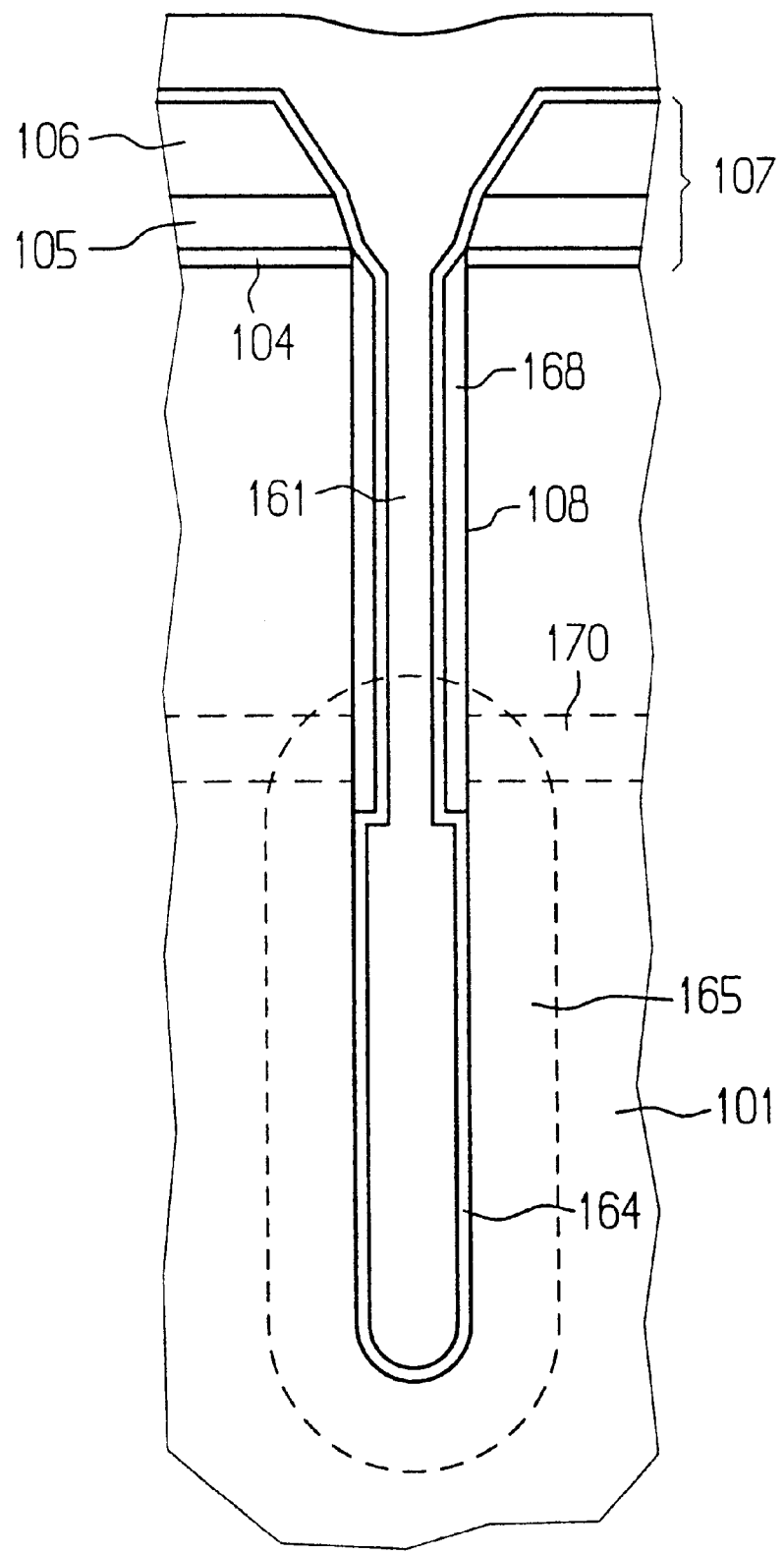

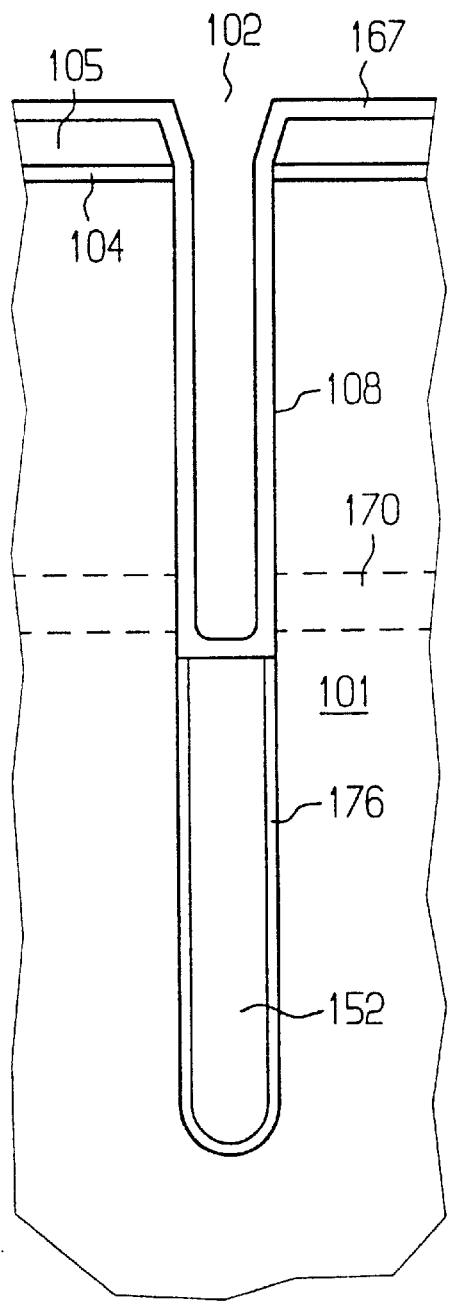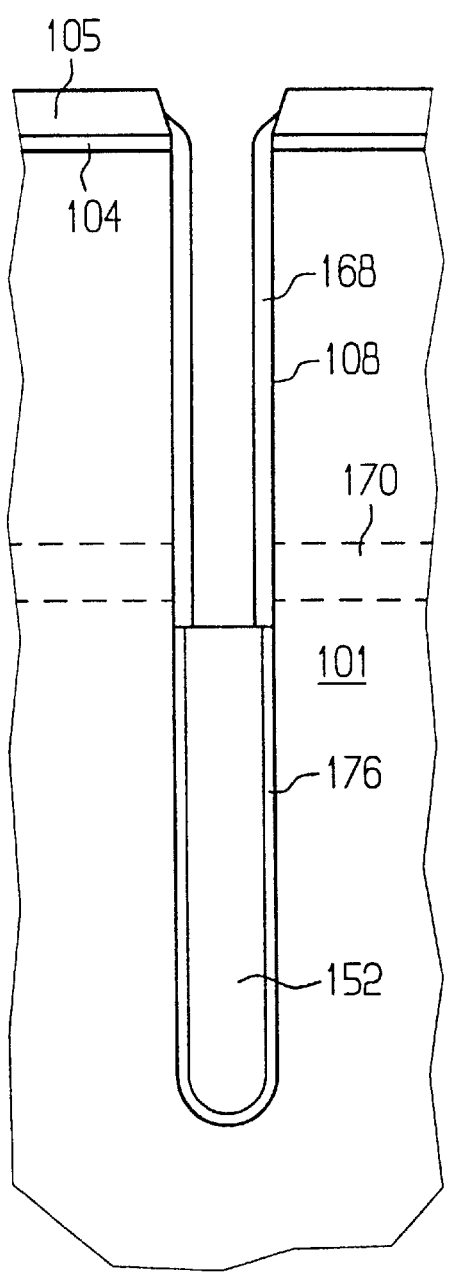

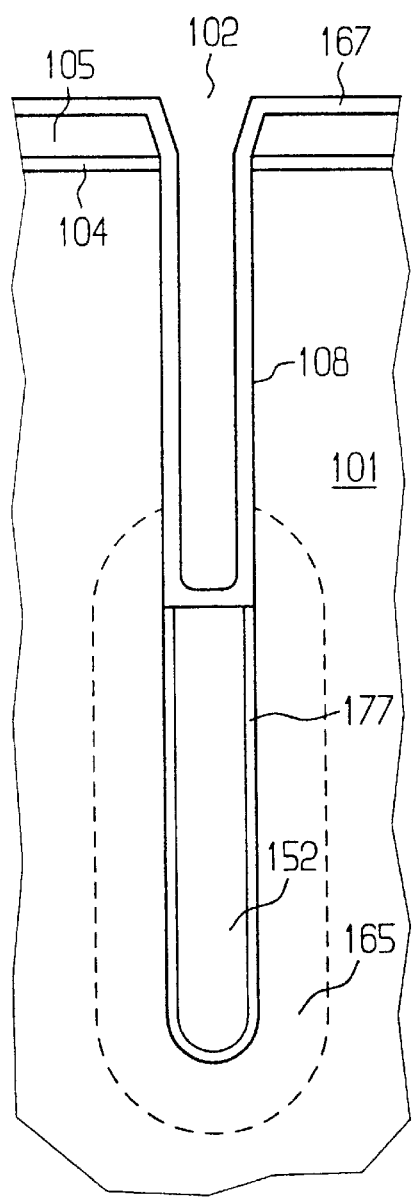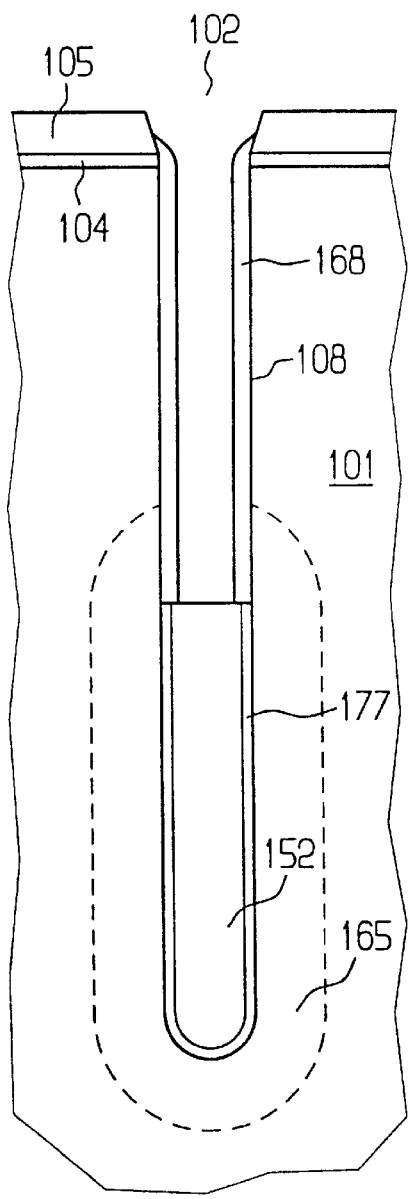

PRODUCTION METHOD FOR A TRENCH CAPACITOR WITH AN INSULATION COLLAR

BACKGROUND OF THE INVENTION

Field of the Invention

The present invention relates to a method for fabricating a trench capacitor with an insulation collar.

Integrated circuits (ICs) or chips use capacitors for the purpose of storing charge. One example of an IC which uses capacitors to store charges is a memory IC, such as, for example, a chip for a dynamic read/write memory with random access (DRAM). The charge state ("0" or "1") in the capacitor represents a data bit in this case.

A DRAM chip contains a matrix of memory cells which are connected up in the form of rows and columns. The row connections are usually referred to as word lines and the column connections as bit lines. The reading of data from the memory cells or the writing of data to the memory cells is realized by activating suitable word lines and bit lines.

A DRAM memory cell usually contains a transistor connected to a capacitor. The transistor contains two diffusion regions separated by a channel above which a gate is arranged. Depending on the direction of the current flow, one diffusion region is referred to as the drain and the other as the source. The designations "drain" and "source" are used mutually interchangeably here with regard to the diffusion regions. The gates are connected to a word line, and one of the diffusion regions is connected to a bit line. The other diffusion region is connected to the capacitor. The application of a suitable voltage to the gate switches the transistor on and enables a current flow between the diffusion regions through the channel in order thus to form a connection between the capacitor and the bit line. The switching-off of the transistor disconnects this connection by interrupting the current flow through the channel.

The charge stored in the capacitor decreases with time on account of an inherent leakage current. Before the charge has decreased to an indefinite level (below a threshold value), the storage capacitor must be refreshed.

Ongoing endeavors to reduce the size of storage devices foster the design of DRAMs having a greater density and a smaller characteristic size, that is to say a smaller memory cell area. In order to fabricate memory cells which occupy a smaller surface region, smaller components, for example capacitors, are used. However, the use of smaller capacitors results in a reduced storage capacitance, which, in turn, can adversely affect the functionality and usability of the storage device. For example, sense amplifiers require a sufficient signal level for reliable read-out of the information in the memory cells. The ratio of the storage capacitance to the bit line capacitance is critical in determining the signal level. If the storage capacitance becomes too small, this ratio may be too small to generate a sufficient signal. Likewise, a smaller storage capacitance requires a higher refresh frequency.

One type of capacitor usually used in DRAMs is a trench capacitor. A trench capacitor has a three-dimensional structure formed in the silicon substrate. An increase in the volume or the capacitance of the trench capacitor can be achieved by etching more deeply into the substrate. In this case, the increase in the capacitance of the trench capacitor does not have the effect of enlarging the surface occupied by the memory cell.

A customary trench capacitor contains a trench etched into the substrate. This trench is typically filled with n+-doped polysilicon, which serves as one capacitor electrode (also referred to as storage capacitor). Optionally, a second capacitor electrode (also referred to as "buried plate") is formed by outdiffusion of $n^-$-type dopants from a dopant source into a region of the substrate which surrounds the lower portion of the trench. An $n^+$-doped silicate glass, such as, for example, an arsenic-doped silicate glass (ASG), serves as the dopant source in this case. A storage dielectric containing nitride is usually used to insulate the two capacitor electrodes.

A dielectric collar is produced in the upper region of the trench in order to prevent a leakage current from the capacitor connection with the buried plate. The storage dielectric in the upper region of the trench, where the collar is to be formed, is removed before said collar is formed. The removal of the nitride prevents a vertical leakage current along the collar.

Although applicable to any desired trench capacitors, the present invention and the problems on which it is based will be explained below with regard to a trench capacitor used in a DRAM memory cell. Such memory cells are used in integrated circuits (ICs), such as, for example, random access memories (RAMs), dynamic RAMs (DRAMs), synchronous DRAMs (SDRAMs), static RAMs (SRAMs), embedded DRAMs and read-only memories (ROMs). Other integrated circuits contain logic devices, such as, for example, programmable logic arrays (PLAs), application-specific ICs (ASICs), mixed logic/memory ICs (embedded DRAMs) or other circuit devices. It is usual for a multiplicity of ICs to be fabricated in parallel on a semiconductor substrate, such as, for example, a silicon wafer. After processing, the wafer is divided in order to separate the ICs into a multiplicity of individual chips. The chips are then packaged into end products, for example for use in consumer products such as, for example, computer systems, cellular telephones, personal digital assistants (PDAs) and further products. For discussion purposes, the invention will be described with regard to the formation of an individual memory cell.

In order to explain the problems on which the present invention is based, first of all a number of customary trench capacitor DRAM memory cells and also methods for fabricating them are explained below.

With reference to FIG. 5, a customary trench capacitor DRAM memory cell 100 is shown. It comprises a trench capacitor 160 formed in a substrate 101. The substrate is lightly doped with p-type dopants (p−), such as e.g. boron (B). The trench 108 is usually filled with polysilicon 161 doped with n-type dopants (n+), such as e.g. arsenic (As) or phosphorus (P). A buried plate 165, which is doped with As for example, is optionally provided in the substrate 101 in the vicinity of the lower region of the trench 108. The As is diffused into the silicon substrate 101 for example from a dopant source, such as ASG for example, which is formed on the sidewalls of the trench 108. The polysilicon 161 and the buried plate 165 serve as the capacitor electrodes.

A storage dielectric 164 isolates these capacitor electrodes. By way of example, the storage dielectric layer 164 comprises nitride or nitride/oxide. Oxide/nitride/oxide or another dielectric layer or a stack of dielectric layers, such as, for example, oxide, nitride oxide or NONO, can likewise be used.

The DRAM memory cell 100 likewise has a transistor 110. The transistor 110 comprises a gate 112 and diffusion regions 113 and 114. The diffusion regions 113, 114, which are separated by a channel 117, are formed by the implantation of n-type dopants, such as, for example, phosphorus (P). A capacitor connection diffusion region 125, which is designated as "capacitor connection", connects the trench capacitor 160 to the transistor 110. The capacitor connection diffusion region 125 is formed by outdiffusion of dopants from the trench polysilicon 161 through a buried strap 162.

A collar 168 is formed on an upper region of the trench 108. The upper region of the trench 108 means the portion which contains the collar 168, and the lower region of the trench means the portion below the collar 168. The collar 168 prevents a leakage current of the capacitor connection 162 to the buried plate 165. The leakage current is undesirable because it impairs the retention time of the memory cell, which increases the refresh frequency and therefore adversely affects the functionality.

A buried well 170 with n-type dopants, such as, for example, P or As, is provided below the surface of the substrate 101. The peak concentration of the dopants in the buried n-type well 170 lies approximately at the underside of the collar 168. The buried well 170 is typically lightly doped in comparison with the buried plate 165. The buried well 170 serves for connecting the buried plates 165 of the DRAM memory cells in the memory cell matrix.

The activation of the transistor 110 by the application of suitable voltages to the gate 112 and the bit line 185 creates a connection to the trench capacitor 160. In general, the gate 112 is connected to a word line 120, and the diffusion region 113 is connected to a bit line 185 in the DRAM matrix via a contact 183. The bit line 185 is insulated from the diffusion regions 113, 114 by means of an interposed dielectric intermediate layer 189.

A narrow insulation trench (STI isolation) 180 is provided in order to insulate the DRAM memory cell 100 from other memory cells or other electrical devices. As shown, a further word line 120' is formed above the trench 108 and insulated from the latter by the STI trench 180. The word line 120', which runs above the STI trench 180, is a word line that runs past. Such a configuration is referred to as a folded bit line architecture.

The customary trench capacitor according to FIG. 5 contains a storage dielectric 164, which is formed in stepped fashion over the collar 168, this obviating the need for removing the upper region of the storage dielectric layer. This avoids the formation of pinholes at the transition between the collar and the upper edge of the storage dielectric layer. In addition, the lower region of the trench has a width or a diameter W2 which has at least the same magnitude as the width or the diameter W1 of the upper region. Accordingly, it is possible to achieve reduced leakage currents and an increased capacitance.

Without restricting the generality, the DRAM memory cell 100 according to FIG. 5 is a MINT memory cell (MINT=merged isolation node trench) with a buried strap 162. Other cell configurations, such as, for example, those which use a strap situated on the surface, can likewise be used. The typical dimensions of a trench 108, which is implemented for example in a 256 Mb DRAM chip using 0.25 mm design rules, are approximately 7–8 mm depth, to be precise with a trench opening of about 0.25 mm times 0.50 mm.

As shown in FIG. 5, the trench capacitor 160 is formed in the substrate 101. The substrate is lightly doped with dopants of a first conduction type, for example. In this example, the substrate 101 is lightly doped with p-type dopants (p−), such as B, for example. The use of a heavily doped p-type substrate (p+) is likewise possible. By way of example, it is possible to use epitaxially fabricated p+/p−-type substrates. Such substrates have a dopant concentration of about 1019 cm−3 with a p_-type epitaxial layer having a thickness typically of 2–3 mm. The concentration of B is about $1.5 \times 10^{16}$ cm$^{-3}$. A p-type well (not shown) is provided for insulating the matrix devices. The doping concentration of the p-type wells is about $5 \times 10^{17}$ to $8 \times 10^{17}$ cm$^{-3}$.

FIGS. 6a–g show method steps of a known method for fabricating the customary DRAM memory cell according to FIG. 5.

With reference to FIG. 6a, the substrate 101 is provided, on which substrate the DRAM memory cell is to be fabricated. The main surface of the substrate 101 is not critical, and any desired suitable orientation, such as, for example, (100), (110) or (111), can be used. In the present example, the substrate 101 is lightly doped with p-type dopants (p−), such as B, for example. The concentration of B is about 1–2 1016 cm$^{-3}$.

The substrate 101 contains the n-doped buried well 170. The buried well 170 has P or As as dopant. In the present example, a mask is patterned in order to define the buried well regions. n-type dopants are then implanted into the buried well regions of the substrate 101. The buried well 170 serves to insulate the p-type well from the substrate 101 and likewise forms a conductive strap between the buried plates 165 of the capacitors. The concentration and energy of the implantation are approximately $>1 \times 10^{13}$ cm$^{-2}$ at about 1.5 MeV. As an alternative, the buried well 170 is formed by implantation and subsequent growth of an epitaxial silicon layer above the substrate surface. This technique is described in U.S. Pat. No. 5,250,829 by Bronner et al.

The substructure stack 107 is formed on the surface of the substrate 101. By way of example, the substructure stack 107 comprises the substructure oxide layer 104 and the substructure stop layer 105. The substructure stop layer 105, which serves as polish or etching stop for subsequent processes, has nitride, for example. Provided above the substructure stop layer 105 is the hard mask layer 106. This hard mask layer 106 comprises TEOS. Other materials, such as BSG, for example, can likewise be used as the hard mask layer. In addition, an antireflection coating (ARC) can be used in order to improve the lithographic resolution.

The hard mask layer 106 is patterned using customary photolithographic techniques, in order to define the region 102 in which the trench is to be formed. These steps include the deposition of a photoresist layer and the selective exposure thereof with the desired pattern. The photoresist is then developed and either the exposed or the unexposed regions are removed, to be precise depending on whether a positive resist or a negative resist is used. The exposed regions of the substructure stack 107 are then etched down to the surface of the substrate 101. A reactive ion etching step (RIE) then forms the deep trench 108.

A polysilicon semiconductor layer 152 is then deposited over the wafer in order to fill the trench 108. Amorphous silicon can likewise be used. Further types of material which have temperature stability up to 1050 to 1100° C. and can be removed selectively with respect to nitride or oxide can likewise be used. The polysilicon 152 is referred to as a polysilicon sacrificial layer, since it is later removed. A natural oxide 151 is typically formed, which oxide lines the trench sidewalls before the trench is filled with the polysilicon 152. The oxide layer 151 typically has a thickness of about 0.3–5 nm.

As shown in FIG. 6b, the polysilicon 152 is then removed down to the underside of the collar to be formed. The removal of the polysilicon 152 comprises, by way of example, planarization by means of chemical mechanical polishing, chemical dry etching (CDE) or reactive ion etching for the purpose of forming a coplanar surface with the top side of the polysilicon in the trench 108 and at the top side of the substructure stack 107. Reactive ion etching is then carried out in order to sink the polysilicon 152 in the trench 108. The use of chemical dry etching to lower the polysilicon 152 in the trench 108 is likewise possible. Preferably, however, the polysilicon 152 is planarized and sunk, typically by 0.5–2 $\mu$m from the substrate surface, by CDE or RIE in a single step.

A dielectric layer is then deposited over the wafer, and covers the substructure stack 107 and the trench sidewalls. The dielectric layer is used to form the collar 168. The dielectric layer is made of oxide, for example. In this example, the dielectric layer is formed by the growth of a layer of thermal oxide and the subsequent deposition of an oxide layer by chemical vapor phase deposition (CVD), such as, for example, plasma-enhanced CVD (PECVD) or low-pressure CVD (LPCVD), using TEOS. The CVD oxide can be densified by a heat-treatment step. The oxide layer is thick enough to avoid a vertical leakage current, namely 10–50 nm. As an alternative, the dielectric layer can have a layer of thermal oxide.

In another example, the dielectric layer is formed from CVD oxide. After the CVD oxide has been formed, a heat-treatment step may be carried out in order to densify the oxide. The heat-treatment step is carried out for example in Ar, $N_2$, $O_2$, $H_2O$, $N_2O$, NO or $NH_3$ atmosphere. An oxidizing atmosphere, such as $O_2$ or $H_2O$, for example, can be used to form a thermal oxide layer under the CVD oxide. Oxygen from the atmosphere then diffuses through the CVD oxide to form a thermal oxide layer on the substrate surface. This advantageously enables the formation of a thermal oxide, if desired, without the need for a thermal oxidation step prior to the deposition of the CVD oxide. The heat-treatment step is typically carried out at a temperature of about 1000–1100° C. and for about 0.5–3 hours.

Furthermore, with reference to FIG. 6b, the dielectric layer is etched by reactive ion etching, for example, in order to form the collar 168. The chemical agents for the reactive ion etching are chosen in such a way that the oxide is etched selectively with respect to the polysilicon 152 and the nitride 106. The reactive ion etching removes the dielectric layer from the surface of the substructure stack and the bottom of the opening. The dielectric layer remains on the silicon sidewall in order to form the collar 168. As illustrated in FIG. 6b, the upper region of the collar 168 is slightly eroded and forms a beveled upper portion.

With reference to FIG. 6c, the polysilicon sacrificial layer 152 is removed from the underside of the trench 108. The removal of the polysilicon sacrificial layer 152 is preferably achieved by CDE. The thin natural oxide layer 151 is then typically present on the uncovered trench sidewalls. This thin natural oxide layer 151 can suffice to serve as CDE etching stop. A CDE etching step, for example using $NF_3$+$Cl_2$ as chemicals, can etch silicon or polysilicon with relatively high selectivity with respect to oxide, which makes it possible to remove the polysilicon using the thin natural oxide layer 151 as an etching stop. By way of example, a selectivity of about 4000:1 was determined for the removal of the polysilicon from the trench 108 using the natural oxide 151 as an etching stop layer.

In another example, a CDE step with a high $Cl_2$ content is used in order to increase the selectivity of the silicon and/or polysilicon etching with respect to the oxide. A flow rate of about 12 sccm results in an effective oxide etching rate of zero, while the polysilicon etching rate is of the order of magnitude of about 2 $\mu$m/min. This enables the natural oxide layer 151 to serve as an efficient etching stop for the removal of the sacrificial polysilicon layer. The thickness of the natural oxide 151 is typically about 0.5 to 1 nm.

As an alternative, wet etching, for example using KOH or $HF$:$HNO_3$:$CH_3COOH$, can likewise be used during the removal of the polysilicon. However, the use of KOH may lead to K contamination on the trench sidewall, which may require an additional cleaning step. Reactive ion etching is likewise possible during the removal of the polysilicon since it acts anisotropically. Suitable chemicals for the reactive ion etching for eliminating the polysilicon contain $SF_6$/$NF_3$/HBr. Other suitable chemicals which etch polysilicon selectively with respect to oxide or nitride are, by way of example, $NF_3$/HBr or $CF_4$/$O_2$ or $CF_4$/$O_2$/$Cl_2$.

The selectivity of the reactive ion etching regarding poly with respect to oxide or nitride is approximately less than 100:1 on planar surfaces but rises to more than approximately 2000:1 on vertical surfaces, to be precise on account of the preferably vertical direction of movement of the ions during the reactive ion etching. On account of the high selectivity of the polysilicon with respect to oxide or nitride on the vertical surfaces, only the upper region of the collar 168 is eroded. This is not a problem, however, since the collar 168 is not eroded below the surface of the substrate.

After the polysilicon has been removed, the buried plate 165 with n-type dopants, such as As or P, for example, is optionally formed as the second capacitor electrode. The collar 168 serves as an insulation mask enabling only the region underneath the collar 168 to be doped. The concentration of the dopants is about $1\times10^{19}$–$10^{20}$ cm–3. In order to form the buried plate 165, it is possible to use vapor phase doping using $PH_3$ or $AsH_3$, plasma doping or plasma immersion ion implantation (PIII). Such techniques are described for example in Ransom et al., J. Electrochemical. Soc. Volume 141, No. 5 (1994), pp. 1378 ff.; U.S. Pat. No. 5,344,381 and U.S. Pat. No. 4,937,205.

Ion implantation using the collar 168 as an insulation mask is likewise possible. As an alternative, the buried plate 165 can be formed using a doped silicate glass, such as ASG, for example, as dopant source. The use of doped silicate glass as dopant source is described for example in Becker et al., J. Electrochemical. Soc., Volume 136 (1989), pp. 3033 ff. If doped silicate glass is used, the layer is removed after the formation of the buried plate.

With reference to FIG. 6d, a storage dielectric layer 164 is deposited on the wafer and covers the surface of the substructure stack 107 and the interior of the trench 108. The storage dielectric layer 164 serves as a storage dielectric for separating the capacitor plates. In one example, the dielectric layer comprises an NO film stack. The NO film stack is formed by deposition of a nitride layer which is then reoxidized. The nitride layer is formed for example by thermal nitration and CVD nitride with a thickness of about 5 nm. The nitride layer is reoxidized at a temperature of about 900° C., by way of example. The reoxidation of the nitride layer marginally increases the thickness of the nitride layer. Further types of dielectric film stacks, such as, for example, oxide-nitride-oxide (ONO) or oxide-nitride-oxide-nitride (ONON), are likewise useful. The use of a thin oxide, nitride or nitrated oxide film is likewise possible.

A further polysilicon layer 161 is deposited on the surface of the wafer for the purpose of filling the trench 108 and for the purpose of covering the substructure stack 107, to be precise by means of CVD, for example, or other known techniques. As shown, the polysilicon layer 161 is conformal and doped with n-type dopants, such as P and As, for example. In one example, the polysilicon layer 161 is doped with As. The concentration of As is about $1 \times 10^{19}$–$1 \times 10^{20}$ cm$^{-3}$. The doped polysilicon 161 serves as a capacitor electrode. As an alternative, the layer may be composed of amorphous silicon. This material can be doped either in situ or sequentially.

With reference to FIG. 6e, the polysilicon layer 161 is lowered for example by a CDE step or by an RIE step using suitable chemicals, such as, for example, $NF_3/Cl_2$ or $NF_3$/HBr or $SF_6$. In another example, the polysilicon 161 is lowered to approximately the level of the substructure nitride 106. This advantageously protects the substructure oxide 105 during the subsequent wet etching processes. If the undercutting does not constitute a problem, the polysilicon can be sunk as far as the depth of the buried strap.

In accordance with FIG. 6f, the residual storage dielectric layer 164 above the polysilicon 161 is removed by wet etching, to be precise using DHF and HF/glycerol, for example. The hard mask layer 106 is then likewise removed wet-chemically, to be precise using BHF. It is also possible to carry out a CDE step for this purpose. The hard mask layer can also be removed earlier in the process sequence, such as, for example, after the formation of the deep trench 108. As shown, the collar 168 and the dielectric layer 164 are likewise slightly sunk in the trench 108.

As shown in FIG. 6g, the buried strap 162 is then formed. The formation of the buried strap 162 is achieved, by way of example, by etching for the purpose of sinking the doped polysilicon 161 in the trench. Reactive ion etching is typically used for this purpose. The nonactive region of the cell is then defined by a customary photolithographic technique and then anisotropically etched, to be precise expediently by reactive ion etching. The nonactive region is the region in which the STI trench 180 is to be formed.

As shown with renewed reference to FIG. 5, the STI trench 180 overlaps part of the trench in order, in this way, to deposit part of the strap 162. In a subsequent heat-treatment step, dopants from the doped polysilicon 161 diffuse upward and outward through the strap 162 in order to form the diffusion region 125. The depth of the STI trench is about 0.25 mm. The nonactive region is typically etched underneath the top side of the oxide of the collar 168. In one example, the nonactive region is etched about 0.25 µm below the substrate surface.

After the nonactive region has been etched, the photoresist and ARC layers are removed. In order to ensure that no photoresist or ARC residues remain behind, cleaning steps can be used. In order to prevent oxygen from diffusing into the silicon and polysilicon sidewalls, an optional lining (not shown) is provided in order to protect the nonactive region. The lining comprises nitride, for example. A passivation oxide is typically grown thermally on the uncovered silicon prior to the formation of the nitride lining. The nitride lining is formed by low-pressure chemical vapor deposition (LPCVD), for example.

A dielectric material is formed on the surface of the substrate. The dielectric material has $SiO_2$, for example. In a further example, the dielectric material is TEOS. A high-density plasma (HDP) oxide or another insulation material can be used. The thickness of the dielectric layer suffices to fill the nonactive region. Since the dielectric layer is typically conformal, planarization methods, such as chemical mechanical polishing, for example, are employed. Such methods are described for example in Nesbit et al., A 0,6 µm$^2$ 256 Mb Trench DRAM Cell with Self-Aligned Buried Strap (BEST), IEDM 93–627. The surface of the substrate 101 is then polished in such a way that the STI trenches 180 and the nitride layer are essentially planar.

The substructure stop layer 105 is then removed by wet chemical etching, for example. The wet chemical etching is selective with respect to oxide. The substructure oxide 104 is likewise removed at this point by wet chemical etching which is selective with respect to silicon. After the removal of the substructure oxide 104, an oxide layer is formed on the surface of the wafer. This oxide layer, which is referred to as a gate sacrificial layer, serves as a screen oxide for subsequent implantations.

In order to define a region for a p-type well for the n-channel transistor 110 of the DRAM memory cell, a photoresist layer is deposited on the top side of the oxide layer and suitably patterned in order to uncover the p-type well region. As shown, p-type dopants, such as boron (B), for example, are implanted into the well region. The dopants are implanted to a depth sufficient to prevent punch-through and to reduce the sheet resistance. The dopant profile is dimensioned in such a way that the desired electrical characteristics are obtained, for example a desired gate threshold voltage (Vth).

In addition, p-type wells are likewise formed for the n-channel supply circuit arrangement. n-type wells are formed for complementary wells in complementary metal oxide silicon devices (CMOS). The formation of n-type wells additionally requires photolithographic steps and implantation steps in order to define and form the n-type wells. As in the case of the p-type wells, the profiles of the n-type wells are tailored to achieving the desired electrical characteristics. Once the wells have been formed, the gate sacrificial layer is removed.

The various layers for forming the gate 112 of the transistor 110 are then fabricated. This comprises the formation of a gate oxidation layer, which serves as gate oxide, a polysilicon layer and a covering nitride layer. The polysilicon layer may typically contain a metal silicide layer, such as WSix, for example, the polycide formed reducing the sheet resistance. The various gate layers are then patterned in order to form the gate stack 112 of the transistor 110. The sidewall of the gate stack is then insulated by thermal oxidation, for example.

A gate stack that runs past as word line 120' is typically formed above the trench and is insulated from the latter by the STI trench 180. The source/drain diffusion regions 413 and 414 are formed by implantation of n-type dopants, such as P or As, for example. In one example, P is implanted into the source and drain regions 113, 114. The dose and the energy are selected in such a way that a dopant profile is obtained which ensures the desired operating characteristics. In order to improve the diffusion and the alignment of the source and the drain with the gate, it is possible to use nitride spacers (not shown). The diffusion region 114 is connected to the diffusion region 125 in order, in this way, to form the capacitor connection.

The dielectric layer 189 is formed over the wafer surface, and it covers the gates 112 and the substrate surface. The dielectric layer comprises BPSG, for example. Further dielectric layers, such as TEOS, for example, are likewise useful. As shown, an edgeless contact opening 483 is etched in order to uncover the diffusion region 413. The contact opening is then filled with a conductive material, such as n⁻-doped polysilicon, for example, in order to form a contact plug therein. The metal layer 485, which represents a bit line, is formed over the dielectric layer in order to form a contact with the source via the contact plug. The structure shown in FIG. 5 is finally obtained in this way.

FIG. 7 shows a further example of a customary DRAM memory cell.

As shown therein, the width W2 or the diameter of the lower region of the trench capacitor 160 is greater than the width W1 or the diameter of the upper region. Increasing W1 increases the capacitance of the capacitor. In order to obtain such a structure, the polysilicon sacrificial layer 152 described in FIG. 6b is eliminated by CDE, for example using $NF_3/Cl_2$. Further chemicals for the selective etching of silicon can likewise be used. In addition, reactive ion etching using $SF_6$, $NF_3$/HBr or wet etching using KOH can be used. The lower part of the trench is widened by CDE etching, for example. The widening of the trench is described for example in T. Ozaki et al., 0,228 mm² Trench Cell Technologies with Bottle-shaped Capacitor for 1 Gigabit DRAMs, IEDM 95, pp. 661 or U.S. Pat. No. 5,336,912 by S. Ohtsuki. The etchant for the CDE etching is selected in such a way that it likewise removes the thin natural oxide film on the trench sidewalls. This can be achieved by reducing the flow rate of $Cl_2$ in order to lower the selectivity of the etching with respect to the oxide, or by changing the chemicals.

The wet etching or the CDE is controlled in such a way that it removes the sacrificial polysilicon, while it limits the widening in such a way that it does not extend into adjacent trenches or make contact therewith. The widening of the lower region of the trench amounts to about 50% of the minimum spacing between adjacent trenches, preferably less than 20–30% of the minimum spacing between adjacent trenches. Since the spacing between adjacent trenches is typically for the minimum dimension, the widening should be limited to less than 50% of the minimum dimension. This affords, by way of example, a bottle-shaped trench whose lower diameter is less than twice the minimum dimension. The widening of the trench preferably amounts to about 20–40% of the minimum dimension.

After the removal of the sacrificial polysilicon and of the etching stop layer, the buried plate 165 may optionally be formed. A variety of techniques for forming the buried plate, such as, for example, vapor phase doping using $AsH_3$ or $PH_3$ at temperatures of about 1000–1100° C., ion implantation of As or P, plasma doping or plasma immersion ion implantation, are likewise possible. The doped polysilicon is then deposited in order to form the capacitor electrode. The doped polysilicon fills the lower region of the trench, with a cavity 172 being formed. Since the cavity 172 is situated in the lower region of the trench, it does not influence the subsequent processing or functionality of the device. Further techniques for increasing the trench capacitance, such as, for example, the formation of hemispherical silicon grains (HSG) in the trench or the roughening of the trench sidewalls prior to the deposition of the storage dielectric, are likewise possible.

FIGS. 8a–c show a further example of a known method for fabricating the DRAM memory cell according to FIG. 5.

With reference to FIG. 8a, the substrate 101 is provided. As shown, the substrate contains the buried n-type well 170. The substructure stack 107, which contains the substructure oxide layer 104, the substructure stop layer 105 and the hard mask layer 106, is formed on the surface of the substrate 101. The substructure stack 107 is patterned in such a way that it defines the trench region 102, and a deep trench 108 is formed therein by reactive ion etching.

After the formation of the trench 108, an etching stop layer 176 is deposited on the trench sidewalls. The etching stop layer 176 is particularly useful if the natural oxide layer 151 (cf. FIG. 4a) on the trench sidewalls is too thin (approximately <1 nm) to function adequately as an etching stop. The etching stop layer 176 covers the substructure stack 107 and lines the trench sidewalls. In a further example, the etching stop layer comprises a material which can be removed selectively with respect to polysilicon. The thickness of the etching stop layer 176 suffices to ensure that subsequently deposited polysilicon sacrificial material 152 is removed from the trench 108 without the sidewalls being widened, in order to avoid deformation of the trench due to undercuts under the substructure oxide, for example. The actual thickness that is necessary is optimized depending on the process conditions of the etching used to remove the sacrificial polysilicon 152. Typically, the thickness of the layer is approximately 1–20 nm, and preferably approximately 1–5 nm.

In a further example, the etching stop layer comprises a dielectric material, such as, for example, oxide, nitride or oxynitride, formed by various techniques, such as, for example, thermal growth or CVD. The etching stop layer preferably has oxide. The use of oxide advantageously avoids the necessity of eliminating the upper region before the formation of the collar, or the removal of the lower region after the removal of the sacrificial polysilicon.

The sacrificial polysilicon layer 152 is deposited over the wafer for the purpose of filling the trench 108. The sacrificial polysilicon 152 is then sunk in order to remove it from the upper region of the trench, to be precise it is sunk approximately as far as the underside of the collar 168 to be formed. Optionally, the uncovered region of the etching stop layer in the upper region of the trench is removed for example using wet etching with DHF chemicals. A collar layer 167 is then formed, which covers the upper region of the trench sidewalls and the top side of the sacrificial polysilicon. The dielectric layer serving as the collar oxide typically comprises a thin thermal oxide under a CVD oxide. It is optionally possible to carry out a heat treatment in order to densify the collar layer. As an alternative, the collar oxide is formed by the deposition of a CVD oxide and the densification of the same in an oxidizing environment. This facilitates the formation of a thermal oxide at the trench/CVD oxide interface, which increases the reliability of the collar 168. The formation of a collar oxide that is grown purely thermally (for example 30–40 nm) is likewise possible but involves a greater tendency to dislocation formation.

With reference to FIG. 8b, the collar layer 168 is etched by reactive ion etching in order to form the collar 168. The sacrificial polysilicon 152 is then removed by reactive ion etching or CDE. Wet etching is likewise useful during the removal of the sacrificial material. The oxide etching stop layer prevents the etchant from widening the trench sidewalls while the sacrificial polysilicon is being removed.

With reference to FIG. 8c, the oxide etching stop layer 176 is then removed. The buried plate 165 is then formed using techniques which have been explained above. A dielectric layer 164 is then deposited over the wafer in such a way that it covers the collar 168 and the trench sidewalls in the lower region of the trench. The dielectric layer serves as the storage dielectric of the trench capacitor. A doped polysilicon layer 161 is then deposited in order to fill the trench. The process for forming the trench capacitor and the memory cell then continues in the manner explained with reference to FIGS. 6d–g.

FIGS. 9a–c show a further example of a customary method for fabricating the DRAM memory cell according to FIG. 5.

As shown in FIG. 9a, the substructure stack 107 with the substructure oxide layer 104, the substructure stop layer 105 and the hard masking layer (not shown) is formed on the surface of the substrate 101. The substructure stack 107 is patterned in order to form a trench region 102. Reactive ion etching is carried out in order to form the deep trench 108 in the trench region 102. A buried n-type well 170 is likewise formed in the substrate 101.

The hard mask layer 106 is removed after the formation of the trench, in order to leave behind the substructure stop layer 105 and the substructure oxide layer 104 on the substrate surface. An etching stop layer 176 is formed in such a way that it serves as an etching stop for eliminating the sacrificial polysilicon 152 from the trench. After the formation of the etching stop layer, the sacrificial polysilicon 152 is deposited in order to fill the trench 108. The sacrificial polysilicon 152 is sunk to a desired depth lying approximately at the underside of the collar 168. The uncovered region of the etching stop layer 176 can be produced for example by wet DHF etching or by CDE etching. The removal of the uncovered region of the etching stop layer 176 likewise removes the RIE damage and contamination of the trench, which improves the reliability of the subsequently formed collar 168. A dielectric layer 167 is then deposited in such a way that it covers the surface and the sidewalls of the trench. The dielectric layer is used to form the collar 168. A heat treatment is carried out in order to densify the dielectric layer 167. As an alternative, a CVD oxide is deposited and heat-treated in an oxidizing atmosphere in order to densify the CVD oxide and in order to form a thermal oxide under the CVD oxide, to be precise in a single thermal processing step.

With reference to FIG. 9b, reactive ion etching is carried out in order to form the collar 168. After the reactive ion etching, the sacrificial polysilicon 152 and the etching stop layer 176 are removed.

With reference to FIG. 9c, the buried plate 165 is formed using the techniques already described. The storage dielectric 164 is subsequently formed. n-doped polysilicon 161 then fills the trench.

To reach the process stage shown in FIG. 6g, the filling polysilicon 161 is then sunk in order to define the buried strap 162. The storage dielectric 164 and the collar oxide 168 are removed, and the polysilicon or the amorphous silicon for the buried strap 162 is deposited, planarized and sunk. At this point the method continues in the manner already described with reference to FIG. 6g.

In connection with this example, it may be mentioned that if the etching stop layer 176 is appropriately thin, that is to say given a thickness through which dopants, such as As and P, can diffuse, the buried plate 165 can be fabricated by outdiffusion of the sacrificial polysilicon 152, which must be doped for this purpose (for example with As or P).

FIGS. 10a–e show a further example of a known method for fabricating the DRAM memory cell according to FIG. 5.

In this example, instead of the undoped etching stop layer 176 or the natural oxide 151, a doped etching stop layer 177 (for example ASG, $PSG_{13}$) is used which serves in particular as a dopant source for forming the buried plate 165.

As shown in FIG. 10a, first of all the trench 108 is formed, as already explained above. After the removal of the hard mask layer 106, for example an ASG layer as etching stop layer 177 with a thickness typically of 5 to 30 nm is then deposited on the substructure stop layer 105 and on the sidewalls of the trench 108. Instead of ASG, it is also possible to use PSG or CVD oxide doped with As or P, for example by means of PLAD or ion implantation.

Optionally, a covering layer (not shown) having a thickness of 0.5–20 nm, such as, for example, PECVD-TEOS or silicon nitride, is formed on the surface of the ASG etching stop layer 177 in order to prevent dopant from the ASG etching stop layer 177 from reaching the sacrificial polysilicon 152 to be provided in the trench 108. The sacrificial polysilicon 152 is subsequently deposited in the trench and on the surface of the wafer. The sacrificial polysilicon 152 need not be doped since, in this example, it does not have the function of a dopant source, rather it should expediently be undoped, which enables a higher deposition rate.

In general, the doped ASG etching stop layer 177 may have a thickness of 2–80 nm, depending on material and trench dimension, in which case it should have a planar surface and step coverage of 50%, for example. Even higher values for the step coverage can be achieved by reducing the deposition pressure.

As shown in FIG. 10b, the sacrificial polysilicon 152 is then sunk by approximately 0.5 to 2 mm from the surface of the substrate 101 in order to define the collar region, to be precise by means of RIE, CDE or wet etching. The ASG etching stop layer 177 is removed, to be precise by means of BHF wet etching or CDE etching, for example. If an optional nitride covering layer has been used, it must be removed before the removal of the ASG layer for example by means of CDE (chemical dry etching) or wet-chemically (for example HF/ethylene glycol).

The collar oxide layer 167 is subsequently deposited by means of CVD oxide formation with a thickness of 10–60 nm on the trench sidewalls and the substrate surface or by means of thermal oxidation of 5–10 nm and subsequent CVD oxide formation in the thickness range of 10–60 nm.

As illustrated in FIG. 10c, in a single process step the collar oxide layer 167 is subsequently densified and the buried plate 165 outdiffused from the ASG etching stop layer 177, for example at 1050° C. and for one hour. If the collar oxide layer 167 has been formed only by CVD deposition, it is expedient firstly to carry out a thermal oxidation, for example at 900° C. and for five minutes (oxygen diffuses through the CVD oxide), in order to form a thermal oxide on the silicon substrate-collar interface, which increases the reliability of the collar 168 to be formed. This thermal oxidation can, of course, be carried out in the same high-temperature process step as the collar densification and the diffusion of the buried plate 165.

Subsequently, as shown in FIG. 10d, reactive ion etching takes place for the purpose of forming the actual collar 168.

Finally, as shown in FIG. 10e, the sacrificial polysilicon 152 is removed by means of reactive ion etching, CDE etching or wet etching, and the ASG etching stop layer 177 is removed by BHF or DHF wet etching or CDE etching. The substructure nitride 105 and the collar oxide 168 are likewise etched in the process. However, this does not constitute a problem since their thickness is significantly greater than that of the ASG etching stop layer 177.

The storage dielectric 164 and the filling polysilicon 161 are subsequently deposited in order to attain the state illustrated in FIG. 9c. Then, in order to achieve the process stage shown in FIG. 6g, the filling polysilicon 161 is sunk in order to define the buried strap 162. The storage dielectric 164 and the collar oxide 168 are removed, and the polysilicon or the amorphous silicon for the buried strap 162 is deposited, planarized and sunk. At this point, the method continues in the manner already described with reference to FIG. 6g.

It shall be mentioned at this point that the process sequence according to this example can, of course, likewise be used for a bottle-shaped trench, which has an increased trench capacitance (cf. FIG. 7).

Equally, the process could be implemented with doped etching stop layer and undoped sacrificial polysilicon also in a manner similar to that described in FIG. 8. Unlike in FIG. 7a, the hard mask layer is not removed as early as after the etching of the trench 102, but rather only after the sacrificial polysilicon 161 has been sunk in the manner described in FIG. 4e and the uncovered storage dielectric 164 has been removed. This procedure is advantageous when the polysilicon etchings (in particular the stripping of the sacrificial polysilicon 161) cause considerable erosion of substructure nitride. However, this method requires additional etching steps, which increases the fabrication costs somewhat.

In addition, it is possible to remove the hard mask layer 106 either as early as after the etching of the deep trench or only after a first step of sinking the sacrificial polysilicon 161 and the removal of the etched-free storage dielectric 164.

The advantages of this example reside in a simplified process for simultaneously forming the collar 168 and the buried plate 165. The buried plate 165 is self-aligned with respect to the underside of the collar 168, in contrast to previously used processes in which the buried plate 165 is formed prior to the formation of the oxide collar by means of a photoresist sinking process (Nesbit et al., see above). Afterwards, in the variant described by Nesbit et al., the collar is formed by polysilicon sinking, with the result that the situation can arise where the buried plate and the oxide collar are misaligned with respect to one another (for example buried plate is seated too deeply or too high and short-circuits the selection transistor). This problem is solved by self-aligning processes in the case of the present invention.

Since the etching stop layer 177 is the dopant source for the buried plate 165, there are no restrictions in respect of the thickness, which significantly reduces the far-reaching selectivity requirements (polysilicon with respect to oxide) for the polysilicon sinking process and the sacrificial polysilicon removal process. These etching processes can therefore be controlled in a significantly simpler manner.

What has been found to be disadvantageous in the case of the known fabrication methods described above is the fact that dry etching process steps, such as, for example, the reactive ion etching of the collar oxide 168 or of the sacrificial polysilicon, thin the substructure stop layer 105 or the pad nitride, so that it is necessary to choose the thickness thereof to be correspondingly larger from the outset. However, this larger thickness of the substructure stop layer 105 makes the lithography steps for the trench and the corresponding etching to form the mask opening more difficult because the process window is made smaller. Moreover, in the case of reactive ion etching of the collar oxide 168 with a decreasing trench width it becomes more difficult to remove the collar oxide 168 from the planar areas in the trench.

SUMMARY OF THE INVENTION

The object of the present invention, therefore, is to provide an improved method for fabricating a trench capacitor with an insulation collar, which method requires no reactive ion etching of the collar oxide.

This object is achieved according to the invention by means of the fabrication method specified in claim 1.

The subclaims relate to preferred developments.

The method according to the invention has the advantage over the known solution approaches that it does not require reactive ion etching of the collar oxide 168, but rather ensures local formation of the collar only on the sidewalls in the upper region of the trench. The problems that occur in the prior art, such as, for example, erosion of the substructure stop layer and lack of scalability of the collar etching for trenches that are becoming smaller, are thereby avoided. Suitable methods for local oxidation are, in particular, the LOCOS or the SELOX process. Regions that are not to be oxidized on the substrate surface or in the lower region of the trench can be protected in particular by a nitride covering.

Exemplary embodiments of the present invention are illustrated in the drawings and are explained in more detail in the description below.

BRIEF DESCRIPTION OF THE DRAWINGS

In the figures:

FIG. 1 shows an exemplary embodiment of a DRAM memory cell according to the present invention with a LOCOS collar;

FIGS. 2a–h show a first embodiment of the inventive method or fabricating the DRAM memory cell according to FIG. 1;

FIG. 3 shows a further exemplary embodiment of a DRAM memory cell according to the present invention;

FIG. 5 shows an example of a customary DRAM memory cell;

FIGS. 6a–g show method steps of a known method for fabricating the customary DRAM memory cell according to FIG. 5;

FIGS. 8a–c show a further example of method steps of a known method for fabricating the DRAM memory cell according to FIG. 5;

FIGS. 9a–c show a further example of method steps of a known method for fabricating the DRAM memory cell according to FIG. 5; and FIGS. 10a–e show a further example of method steps of a known method for fabricating the DRAM memory cell according to FIG. 5.

FIG. 1 shows an exemplary embodiment of a DRAM memory cell according to the present invention.

DESCRIPTION OF THE PREFERRED EMBODIMENTS

The DRAM memory cell shown in FIG. 1 corresponds to the customary memory cell shown in FIG. 5 with the exception of the fact that the collar 168' has been formed selectively by means of a local thermal oxidation step (LOCOS) in the upper region of the trench 108 and, therefore, has the bird's beak form which is typical of this on its underside.

FIGS. 2a–h show a first embodiment of the inventive method for fabricating the DRAM memory cell according to FIG. 1.

In this first embodiment, as in the example according to FIGS. 10a–e, a doped etching stop layer 177 (for example ASG, PSG, . . .) is used which serves, in particular, as a dopant source for the formation of the buried plate 165.

Figure 2A:
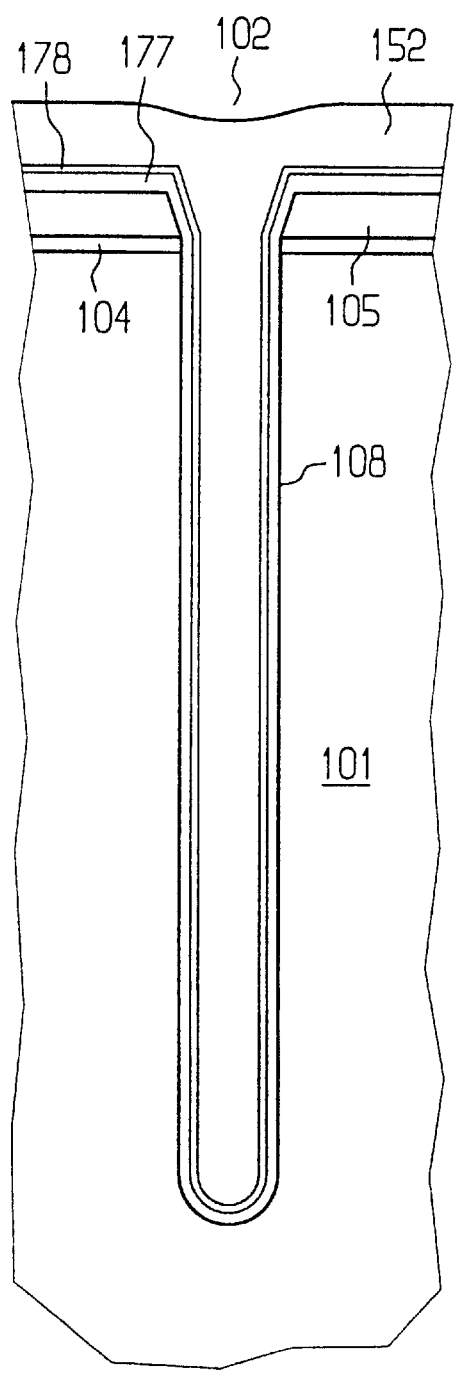

As shown in FIG. 2a, first of all the trench 108 is formed, as already explained in connection with the prior art. By way of example, an ASG layer as etching stop layer 177 with a thickness typically of from 5 to 30 nm is then deposited after the removal of the hard mask layer 106 on the substructure stop layer 105 and on the sidewalls of the trench 108. Instead of ASG, it is also possible to use PSG or CVD oxide doped with As or P, for example by means of PLAD or ion implantation. Likewise, vapor phase diffusion (e.g. $AsH_3$, $PH_3$), typically at 950–1050° C., could also be used.

In general, the thickness of the doped ASG etching stop layer 177 may be 2–80 nm, depending on the material and trench dimension, in which case it should have a planar surface and a step coverage of 50%, for example. Even higher values for the step cover age can be achieved by reducing the deposition pressure.

After that, a nitride or oxinitride covering layer 178 is formed with a thickness of 5–30 nm depending on the etching selectivity, for example by means of CVD (LPCVD, PECVD), on the surfa ce of the ASG etching stop layer 177, in order, on the one hand, to serve as a mask during the subsequent local collar oxidation step and, on the other hand, to prevent dopant from the ASG etching stop layer 177 from reaching the sacrificial polysilicon 152 that is to be provided in the trench 108.

Afterwards, the sacrificial polysilicon 152 is deposited in the trench and on the surface of the wafer. The sacrificial polysilicon 152 does not have to be doped, since it does not have the function of a dopant source in this example, rather it should expediently be undoped, this enabling a higher deposition rate.

Figure 2B:
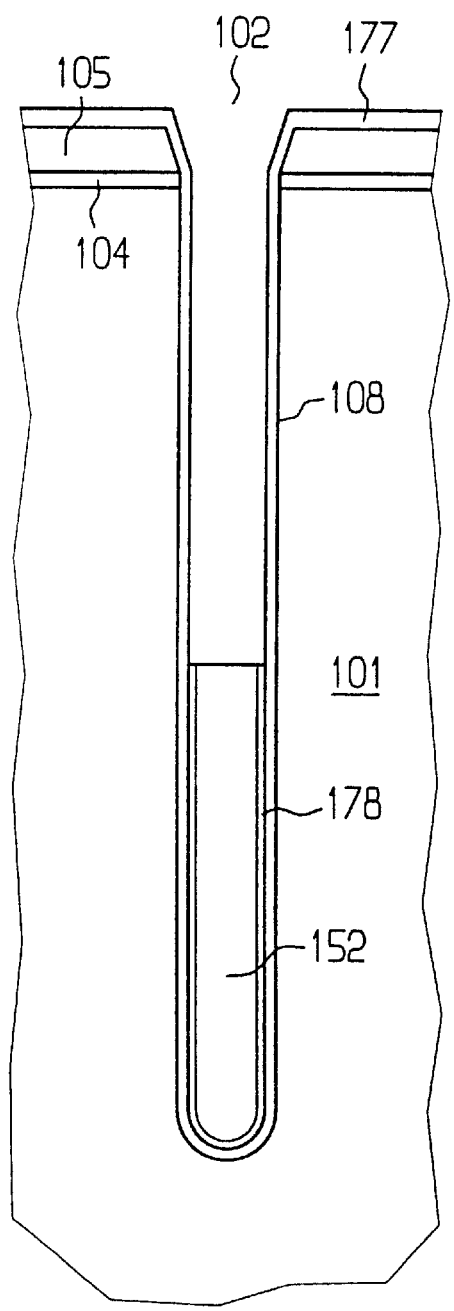

As shown in FIG. 2b, the sacrificial polysilicon 152 is then sunk by approximately 0.5 to 2 $\mu$m from the surface of the substrate 101 in order to define the collar region, to be precise by means of RIE, CDE or wet etching selectively with respect to oxide and nitride.

The covering layer 178 is then removed in the collar region, to be precise for example by CDE (chemical dry etching) using CF4/O2/N2 or wet-chemically using HF/ethylene glycol.

Afterwards, as shown in FIG. 2c, the sacrificial polysilicon 152 is removed by means of reactive ion etching, CDE etching or wet etching in the lower trench region selectively with respect to the substructure stop layer 105, with respect to the ASG etching stop layer 177 and with respect to the covering layer 178. The ASG etching stop layer 177 is then removed by BHF or DHF wet etching or CDE etching in the collar region selectively with respect to the substructure stop layer 105 and with respect to the covering layer 178.

The collar oxide layer 168' is subsequently deposited, as shown in FIG. 2d, by means of local thermal oxidation (LOCOS) for example at 1050° C. for one hour with a thickness of 20–40 nm, in order to produce the typical bird's beak form. At the same time, the outdiffusion of the buried plate 165 from the ASG etching stop layer 177 is expediently effected in a single process step.

This obviates the reactive ion etching for forming the actual collar 168, which is necessary in the case of the prior art mentioned above and entails the disadvantages mentioned.

Next, as shown in FIG. 2e, the covering layer 178 is removed in the lower region of the trench 108, to be precise for example by CDE (chemical dry etching) using $CF_4/O_2/N_2$ or wet-chemically using HF/ethylene glycol. This removal of the covering layer 178 is done selectively with respect to the collar oxide 168' or with a lower degree of selectivity using HF/ethylene glycol, for example, in which case the collar must then be made correspondingly thicker (typically 5 nm).

Afterwards, as illustrated in FIG. 2f, the ASG etching stop layer 177 is removed by BHF or DHF wet etching or CDE etching in the lower region of the trench 108 as selectively as possible with respect to the substructure stop layer 105 and with respect to the collar oxide 168'. It shall be noted in this respect that a very high selectivity cannot be attained in this process step, in other words the substructure stop layer 105 and the collar oxide 168' are likewise etched. Since the thickness of the ASG etching stop layer is typically only 5–10 nm on the trench sidewall, while the thickness of the collar oxide is typically 20–40 nm and the substructure stop layer has a thickness of 100–200 nm, etching erosion of the substructure stop layer 105 and of the collar oxide 168' by a few (for example 5–10) nm in the course of this step is tolerable.

In accordance with FIG. 2g, the storage dielectric 164 and the As- or P-doped filling polysilicon 161 are deposited.

Figure 6A:
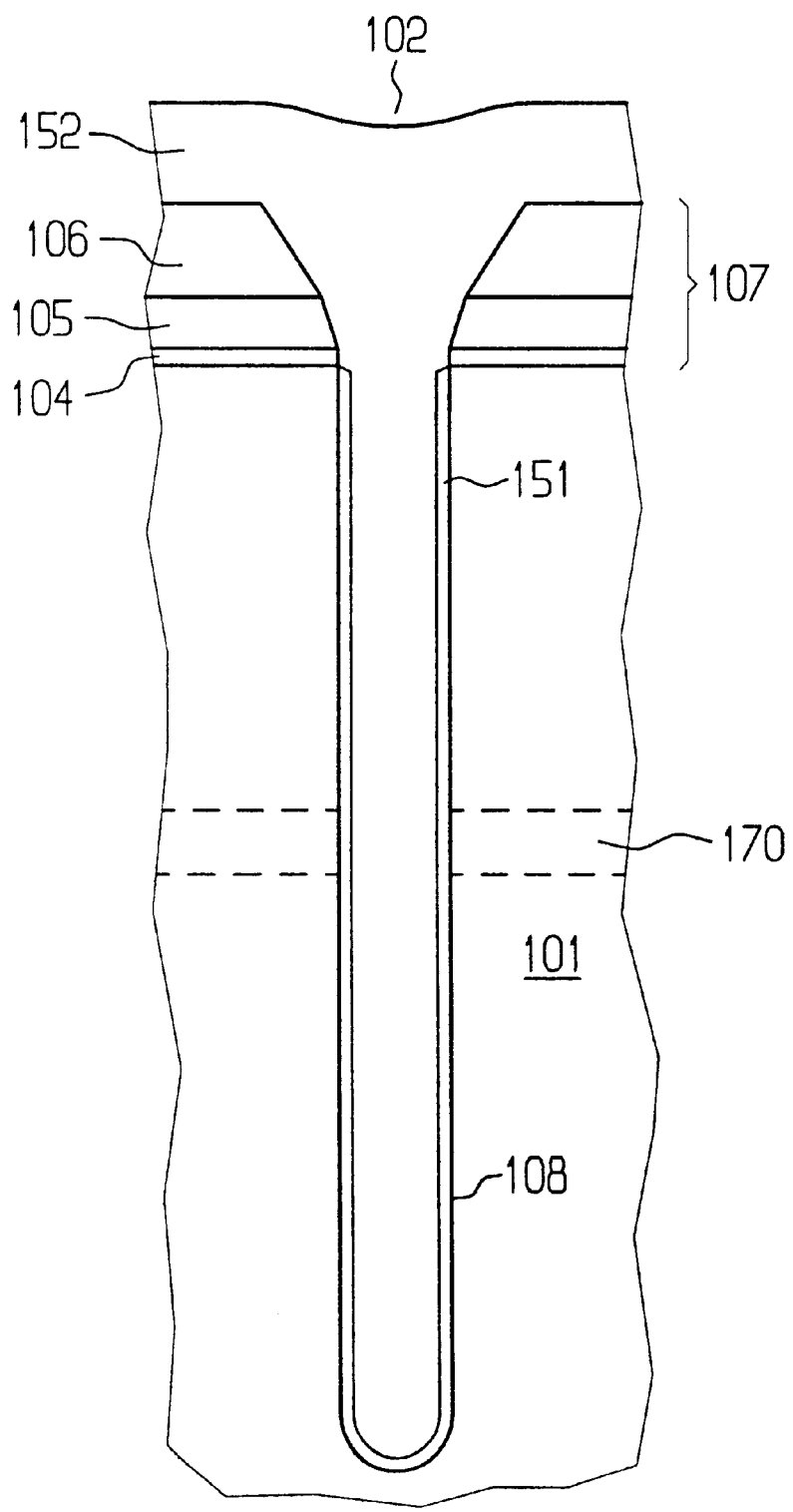
Figure 6D:
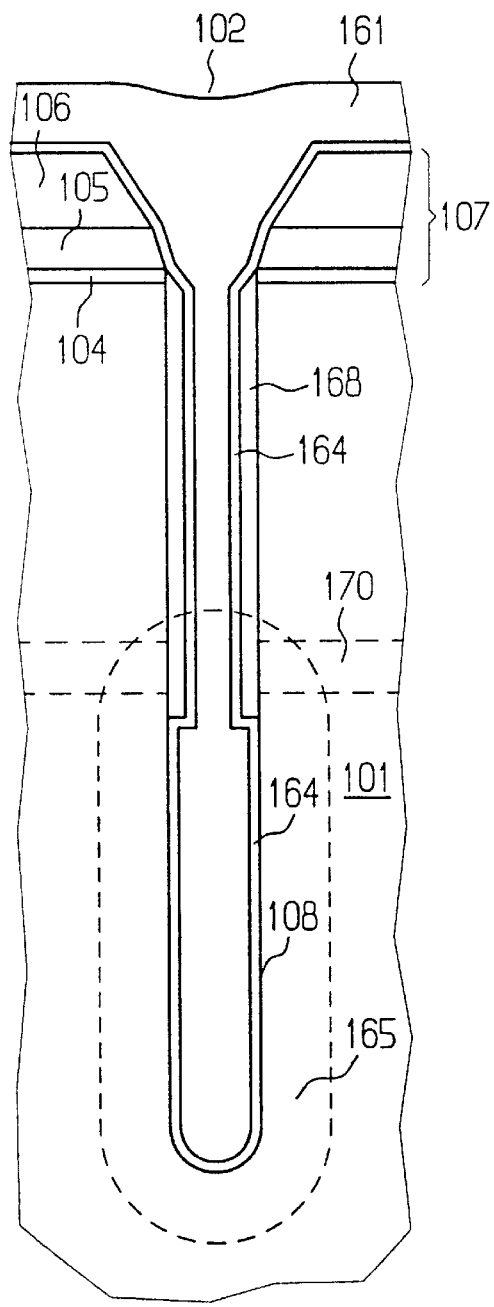
Figure 6E:
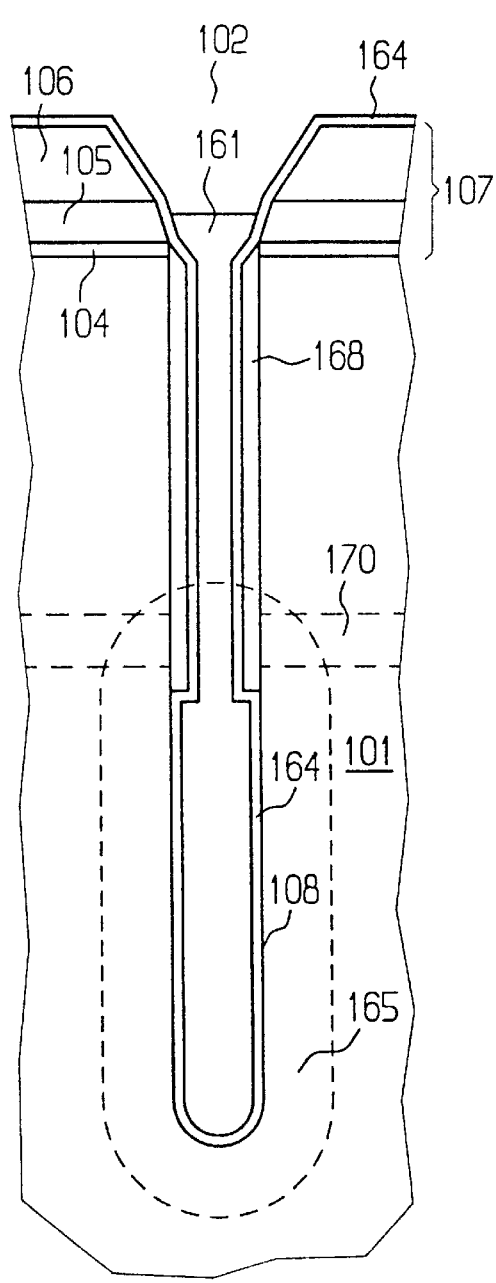
Figure 7:
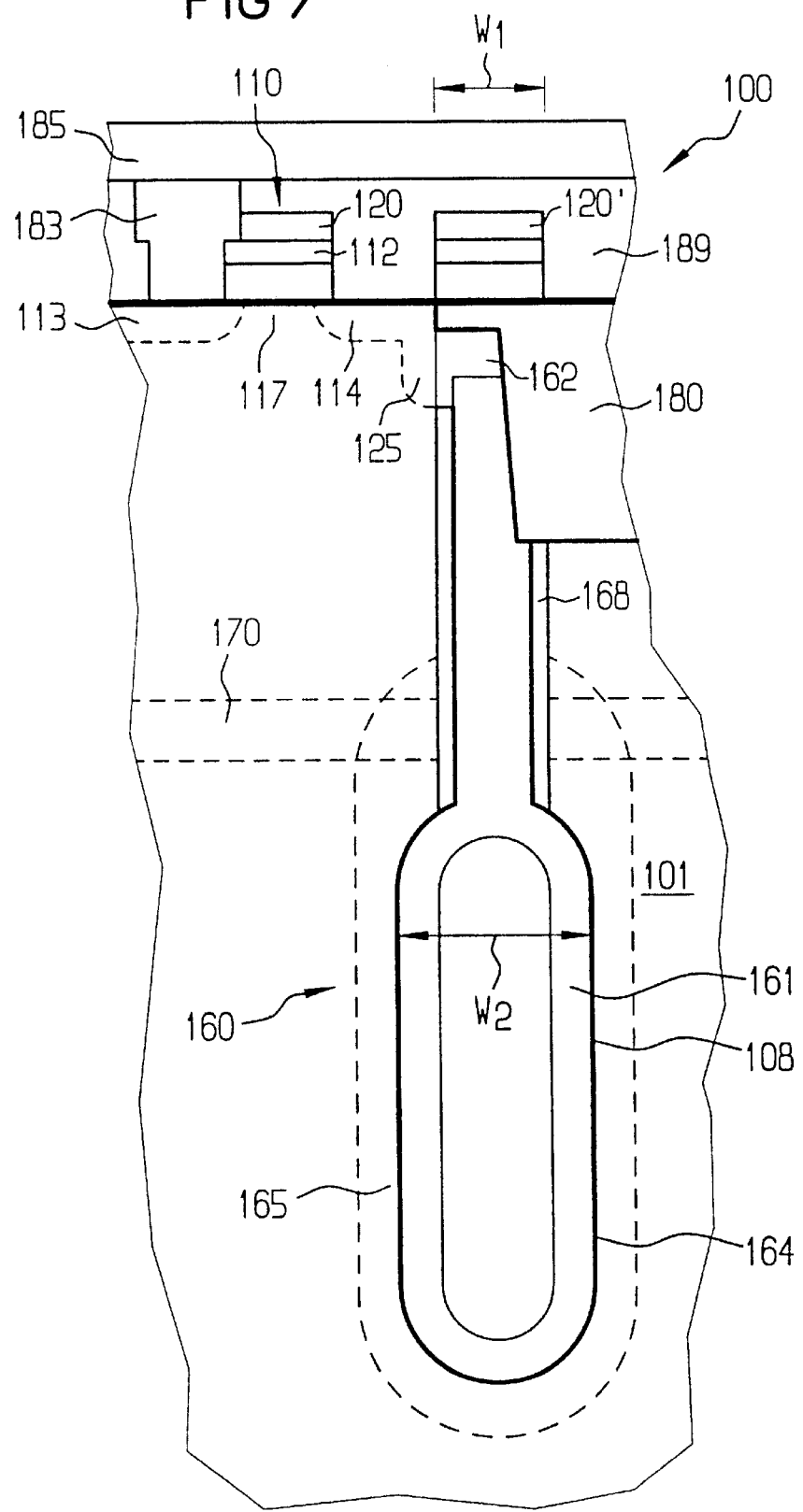
FIG. 7 shows a further example of a customary DRAM memory cell.
Figure 9C:
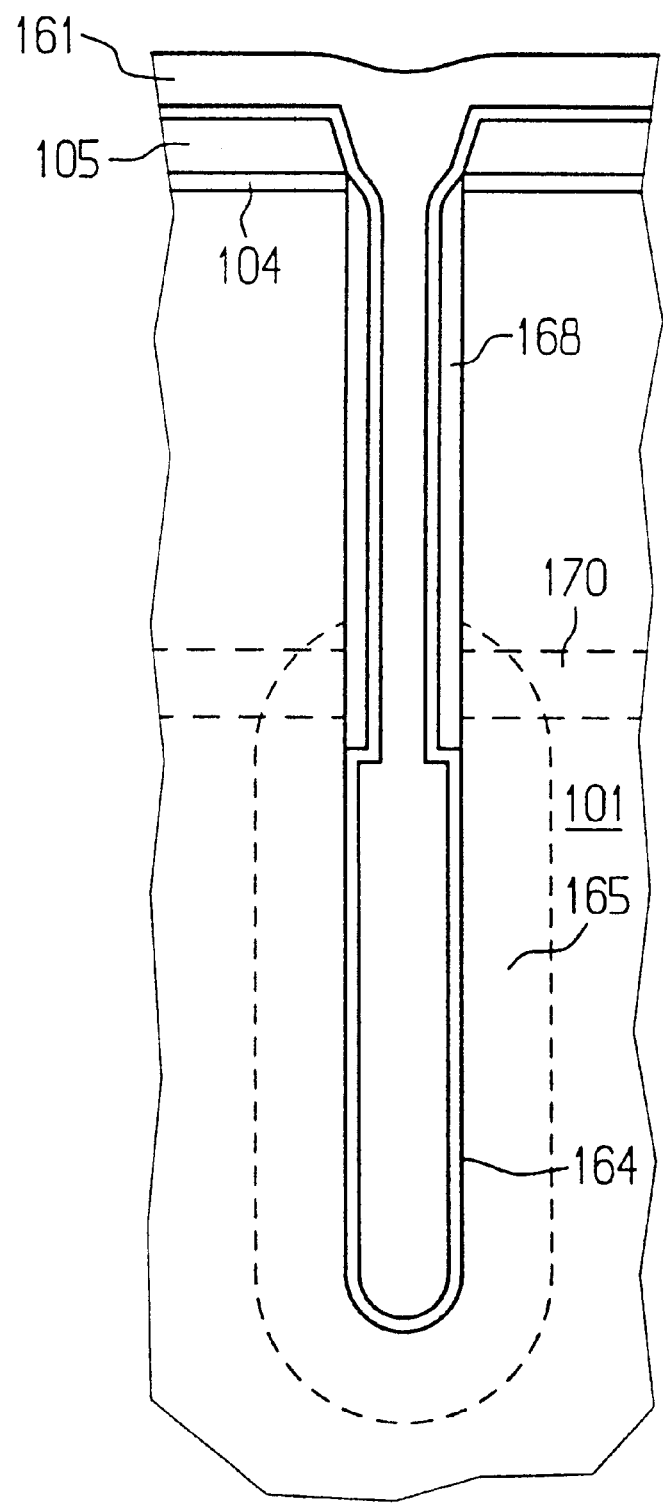
Figure 10A:
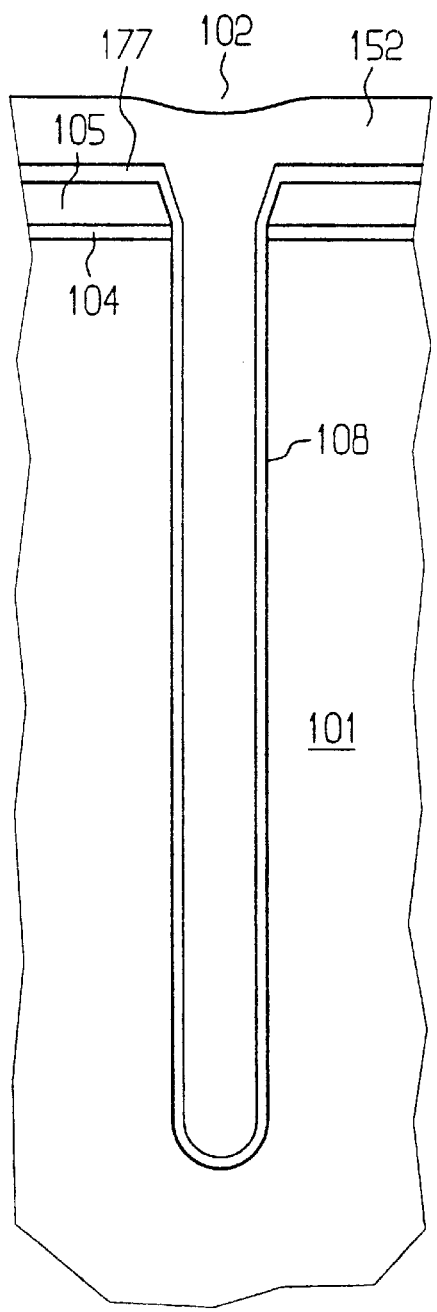
Figure 10B:
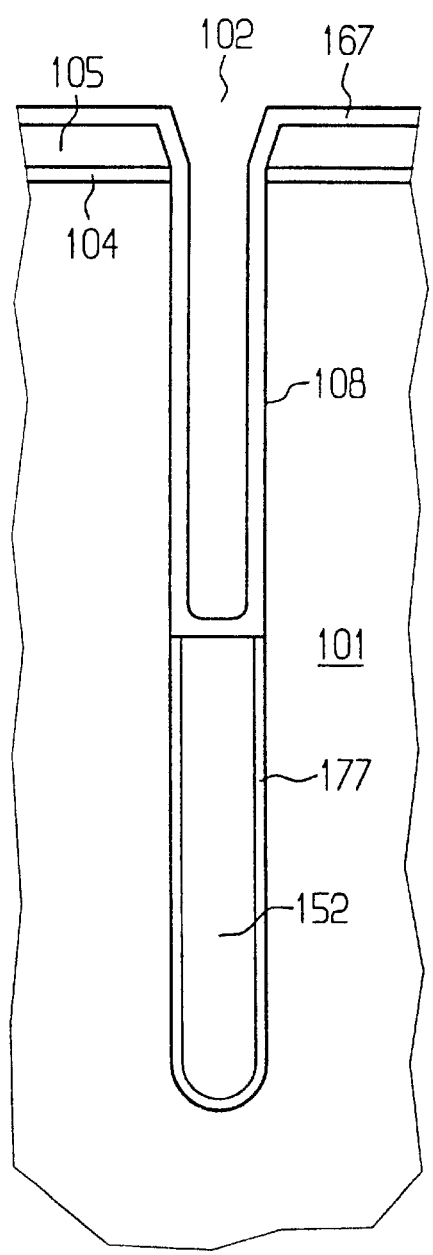
Figure 10E:
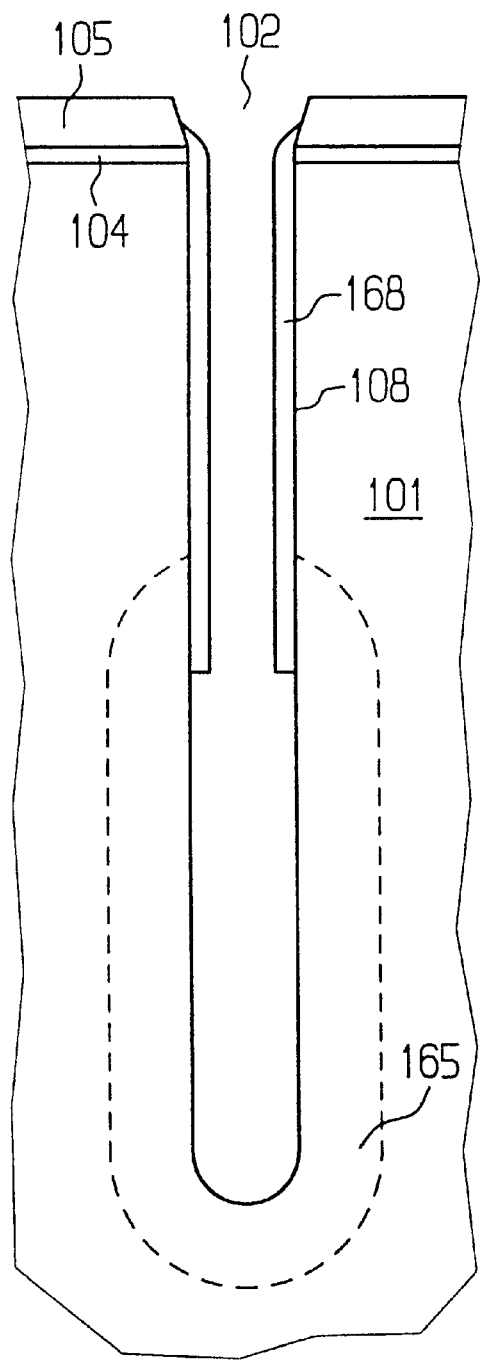

In order to reach the process stage shown in FIG. 2h, the filling polysilicon 161 is then sunk in order to define the buried strap 162. The storage dielectric 164 and the collar oxide 168 are removed, and the polysilicon or the amorphous silicon for the buried strap 162 is deposited, planarized and sunk. At this point, the method continues in the manner already described with reference to FIG. 6g in connection with the prior art.

It shall be mentioned at this point that the process sequence according to this example can, of course, likewise be used for a bottle-shaped trench, which has an increased trench capacitance, as indicated in FIG. 3.

According to a further embodiment (not illustrated), an undoped ASG etching stop layer could be used and the buried plate 165 could then optionally be provided after the removal of the undoped ASG etching stop layer in the lower region of the trench 108.

In particular, this could be done by vapor phase doping using $AsH_3$ or $PH_3$, plasma doping (PLAD) or a PIII (plasma immersion ion implantation) process or customary ion implantation.

Customary ion implantation could even be carried out before the removal of the etching stop layer or of the covering layer, in order to utilize this (these) layer(s) as screen layers.

In the case of plasma doping (PLAD) or a PIII (plasma immersion ion implantation) processor customary ion implantation, an additional drive-in annealing step may be necessary, such as, for example, at 1000° C. for one hour in an N2 atmosphere.

In general, this first embodiment provides for the formation of an insulation collar by means of local oxidation on silicon, and an optional buried plate in a self-aligning manner with respect to the LOCOS collar using polysilicon sinking instead of a resist process, which enables better control of the sinking. Control of the sinking is important in order to keep the vertical parasitic field-effect transistor with the collar as gate closed under all circumstances. A covering layer in the lower region of the trench and the substructure stop layer, which is likewise preferably made of nitride, ensure that the LOCOS oxide grows only in the upper region of the trench in order to form the finished collar.

A certain problem arises in the case of the LOCOS collar due to dislocation formation as a result of thermal oxide stress and a variable retention time resulting from this. There are also thickness fluctuations along the periphery, since the growth rate of the oxide depends on the crystallographic direction.

Figure 4:
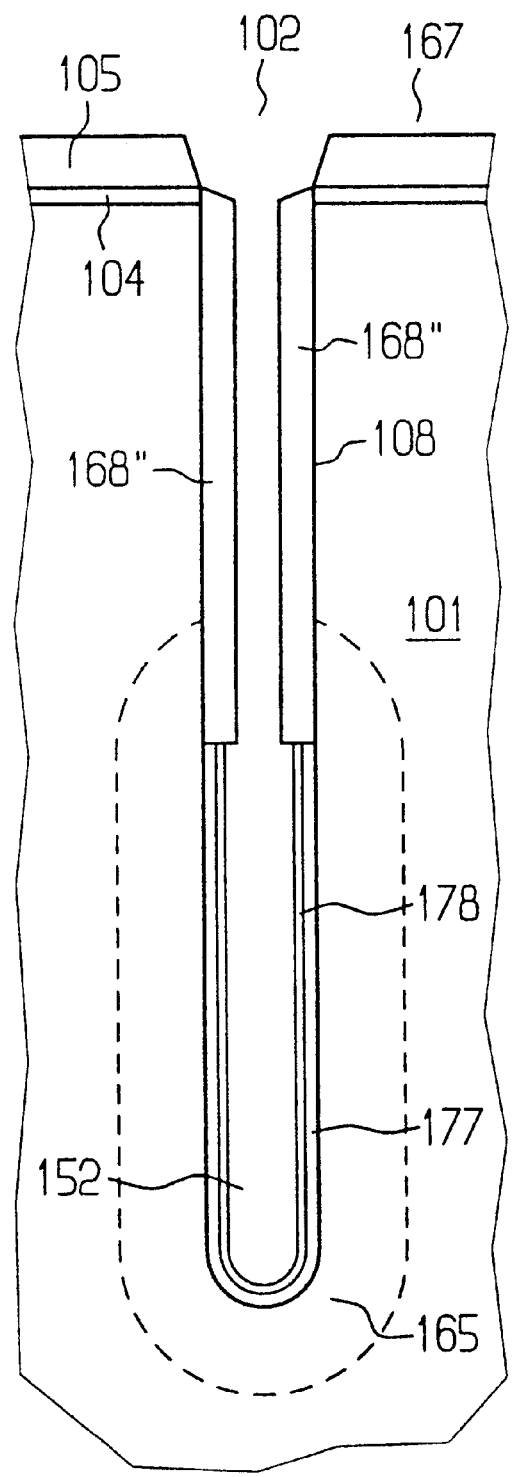
FIG. 4 shows a second embodiment of the inventive method for fabricating a DRAM memory cell, which is modified in comparison with FIG. 1, with a SELOX collar.

FIG. 4 shows a second embodiment of the inventive method for fabricating a DRAM memory cell, which is modified in comparison with FIG. 1, with a SELOX collar.

In this case, FIG. 4 corresponds to the process stage illustrated in FIG. 2d, a collar oxide layer 168" being provided by selective deposition of CVD oxide (SELOX process) in the case of this second embodiment. In addition to the advantages of the first embodiment, this affords the specific advantage that dislocation formation of the kind that can occur during the LOCOS process on account of mechanical stresses in the collar region is minimized, since a CVD oxide collar is used. In addition, the thickness is more uniform in the case of the selective CVD process, since fewer crystallographic variations occur in the layer. Finally, the widening of the upper trench region typically by 5 nm is significantly less than that of the LOCOS process typically by 30 nm.

In particular, the SELOX process is disclosed in U.S. Pat. No. 5,399,389 by Gabric and provides for the following general procedure. First of all, provision is made of precursor layers with different growth rates for $SiO_2$ on surfaces of different heights. Ozone-activated CVD deposition of $SiO_2$ is then carried out on these surfaces, the growth of the $SiO_2$ layer being faster on surfaces lying at a lower level than on surfaces lying at a higher level. The surfaces are ultimately aligned by continuing the process until a planar level has been reached. For further details relating to the process implementation, reference is made to U.S. Pat. No. 5,399,389.

Further details relating to the SELOX process can be found in N. Elbel et al., "A new STI Process Based on Selective Oxide Deposition", 1998 Symposium on VLSI Technology Digest of Technical Papers, IEEE, p. 21.2 ff.

In particular, the collar oxide 168" is deposited in the collar region selectively with respect to the substructure stop layer 105 and with respect to the covering layer 178 with a thickness typically of 50 nm. In comparison with this, the thickness on the substructure stop layer 105 and on the covering layer 178 is typically only 10 nm or less.

The etching back of the oxide from the substructure stop layer 105 and the covering layer 178 can then be effected for example by means of isotropic wet etching using BHF, to be precise preferably before densification of the collar in a high-temperature step.

It is also possible to carry out the deposition of the collar, the densification and the driving-in of the buried plate 165 in a common process step, for example at 900° C. for 5 minutes with addition of O2 and at 1050° C. for 30 minutes with addition of N2, and only afterwards the etching back.

The removal of the layers 177 and 178 is effected, as described for the first embodiment, for example by an HF/ethylene glycol etching step.

The etching-back step may even be obviated in the case of a highly selective oxidation step with a selectivity of 80:1, for example.

A further alternative is to combine the etching back with the removal of the layers 177 and 178 in a single dry etching step.

The residual collar should then typically have a thickness of 30 nm.

The process steps of the second embodiment otherwise correspond to those of the first embodiment explained with reference to FIGS. 2a–h.

It shall be mentioned at this point that the process sequence according to this second embodiment can, of course, likewise be used for a bottle-shaped trench, which has an increased trench capacitance, as indicated in FIG. 3.

Furthermore, in the second embodiment, too, an undoped ASG etching stop layer could be used and the buried plate 165 could then optionally be provided after the removal of the undoped ASG etching stop layer in the lower region of the trench 108, as already explained thoroughly above in connection with the first embodiment.

According to a further embodiment (not illustrated), in the first and preferably in the second embodiment, the sacrificial filling material could be, for example, photoresist instead of polysilicon, or another suitable filling material. In this case, the corresponding sinking and removal steps have to be suitably adapted. In the case of photoresist, CDE etching or wet etching using $H_2SO_4/H_2O_2$ would be appropriate, for example.

Although the present invention has been described above using preferred exemplary embodiments, it is not restricted thereto but rather can be modified in diverse ways.

In particular, the materials referred to are only by way of example and can be replaced by other materials having suitable properties. The same applies to the etching processes and deposition processes mentioned.

All the embodiments shown can also be combined with one another, as far as the materials and the sequence of the process steps is concerned.

What is claimed is:

1. A method for fabricating a trench capacitor, which comprises the following steps:

providing a substrate;

forming a trench with a trench wall in the substrate;

providing a first layer on the trench wall;

providing a second layer on the first layer on the trench wall;

filling the trench with a first filling material;

removing the first filling material from an upper region of the trench to define a collar region;

subsequently removing the second layer from the upper region of the trench;

subsequently removing the first filling material from the lower region of the trench;

subsequently removing the first layer from the upper region of the trench;

subsequently locally oxidizing the upper region of the trench to produce an insulation collar;

removing the first and second layers from a lower region of the trench;

forming a dielectric layer in the lower region of the trench and on an inner side of the insulation collar; and filling the trench with a conductive second filling material.

2. The method according to claim 1, which comprises a step of forming a buried plate in the substrate in a vicinity of the lower region of the trench.

3. The method according to claim 2, wherein the buried plate is formed self-aligned with respect to the insulation collar.

4. The method according to claim 3, wherein the buried plate is formed by outdiffusion from the first layer.

5. The method according to claim 4, wherein the outdiffusion from the first layer is carried out simultaneously with one of an oxidation and a densification of the collar.

6. The method according to claim 3, wherein the step of forming the buried plate comprises carrying out a separate step selected from the group consisting of vapor phase doping, PLAD, PIII, and ion implantation.

7. The method according to claim 1, wherein the step of locally oxidizing the upper region of the trench comprises selective local SELOX oxidation.

8. The method according to claim 1, wherein the step of locally oxidizing the upper region of the trench comprises thermal LOCOS oxidation.

9. The method according to claim 1, which comprises selecting the first filling material from the group consisting of polysilicon and photoresist.

10. The method according to claim 1, which comprises expanding the lower region of the trench relative to the upper region of the trench to form a bottle shape.

11. The method according to claim 1, which comprises using a nitride-containing layer as the second layer.

12. The method according to claim 1, which comprises providing a layer defining a trench opening on a top side of the substrate.

13. The method according to claim 12, wherein the layer on the top side of the substrate is a nitride-containing layer defining the trench opening.

14. The method according to claim 1, which comprises forming the trench in a semiconductor substrate and forming a semiconductor memory cell with an insulation collar.

* * * * *